(12) United States Patent
Neves

(10) Patent No.: US 10,379,153 B1
(45) Date of Patent: *Aug. 13, 2019

(54) PRINTED CIRCUIT BOARD TEST COUPON FOR ELECTRICAL TESTING DURING THERMAL EXPOSURE AND METHOD OF USING THE SAME

(71) Applicant: Greater Asia Pacific Limited, Mongkok, KL (HK)

(72) Inventor: Robert Neves, Mongkok (HK)

(73) Assignee: Greater Asia Pacific Limited, Mongkok (HK)

( * ) Notice: Subject to any disclaimer, the term of this patent is extended or adjusted under 35 U.S.C. 154(b) by 0 days.

This patent is subject to a terminal disclaimer.

(21) Appl. No.: 16/399,470

(22) Filed: Apr. 30, 2019

Related U.S. Application Data

(63) Continuation-in-part of application No. 16/209,853, filed on Dec. 4, 2018.

(51) Int. Cl.
*G01R 31/28* (2006.01)
*H05K 1/02* (2006.01)
*H05K 1/11* (2006.01)

(52) U.S. Cl.
CPC ..... *G01R 31/2817* (2013.01); *G01R 31/2806* (2013.01); *G01R 31/2818* (2013.01); *H05K 1/0268* (2013.01); *H05K 1/115* (2013.01)

(58) Field of Classification Search
CPC .................................................. G01R 31/2818
(Continued)

(56) References Cited

U.S. PATENT DOCUMENTS 5,006,808 A * 4/1991 Watts ................. G01R 31/2805
324/537
5,485,081 A 1/1996 Whitehead
(Continued)

*Primary Examiner* — Reena Aurora
(74) *Attorney, Agent, or Firm* — Knobbe, Martens, Olson & Bear LLP

(57) ABSTRACT

A printed circuit board (PCB) test coupon for thermal exposure and electrical testing includes a double sided or multi-layer substrate with a plurality of vias formed within the substrate of the test coupon (blind, buried, stacked vias) or extending through the entire substrate (through hole/via) from a first surface on the first side of the plated hole/via to a second surface on the second side of the plated hole/via. Each of a first plurality of trace patterns interconnect a subset of the plurality of plated holes/vias on the first side of the plated holes/vias, and each of a second plurality of trace patterns interconnect a different subset of the plurality of plated holes/vias on the second side of the plated holes/vias. The first and second pluralities of trace patterns have different patterns and connect to connection points in a connector pattern defined in the substrate. One of the second plurality of trace patterns is configured to measure temperature and two of the second plurality of trace patterns are configured to measure calibration/drift by resistance measurements. The test coupon provides test nets that include a single plated hole/via, and optionally includes daisy chain test nets. A resistance measurement of each plated hole/via (or daisy chain) is provided by connecting 2 wires of a 4-wire kelvin bridge measurement system to the first and second sides of the plated hole/via (or daisy chain) using connection points for one of the first plurality of trace patterns and one of the second plurality of trace patterns that connect to each side of the said plated hole/via (or daisy chain).

19 Claims, 20 Drawing Sheets

(58) Field of Classification Search
USPC .................................................. 324/763.01
See application file for complete search history.

(56) References Cited

U.S. PATENT DOCUMENTS

| | | | |
|---|---|---|---|
| 5,631,856 A * | 5/1997 | Keller | ...................... G01R 1/04 324/750.16 |
| 5,701,667 A | 12/1997 | Birch | |
| 7,287,903 B2 | 10/2007 | Estes | |
| 2007/0222473 A1 | 9/2007 | Eto | |

* cited by examiner

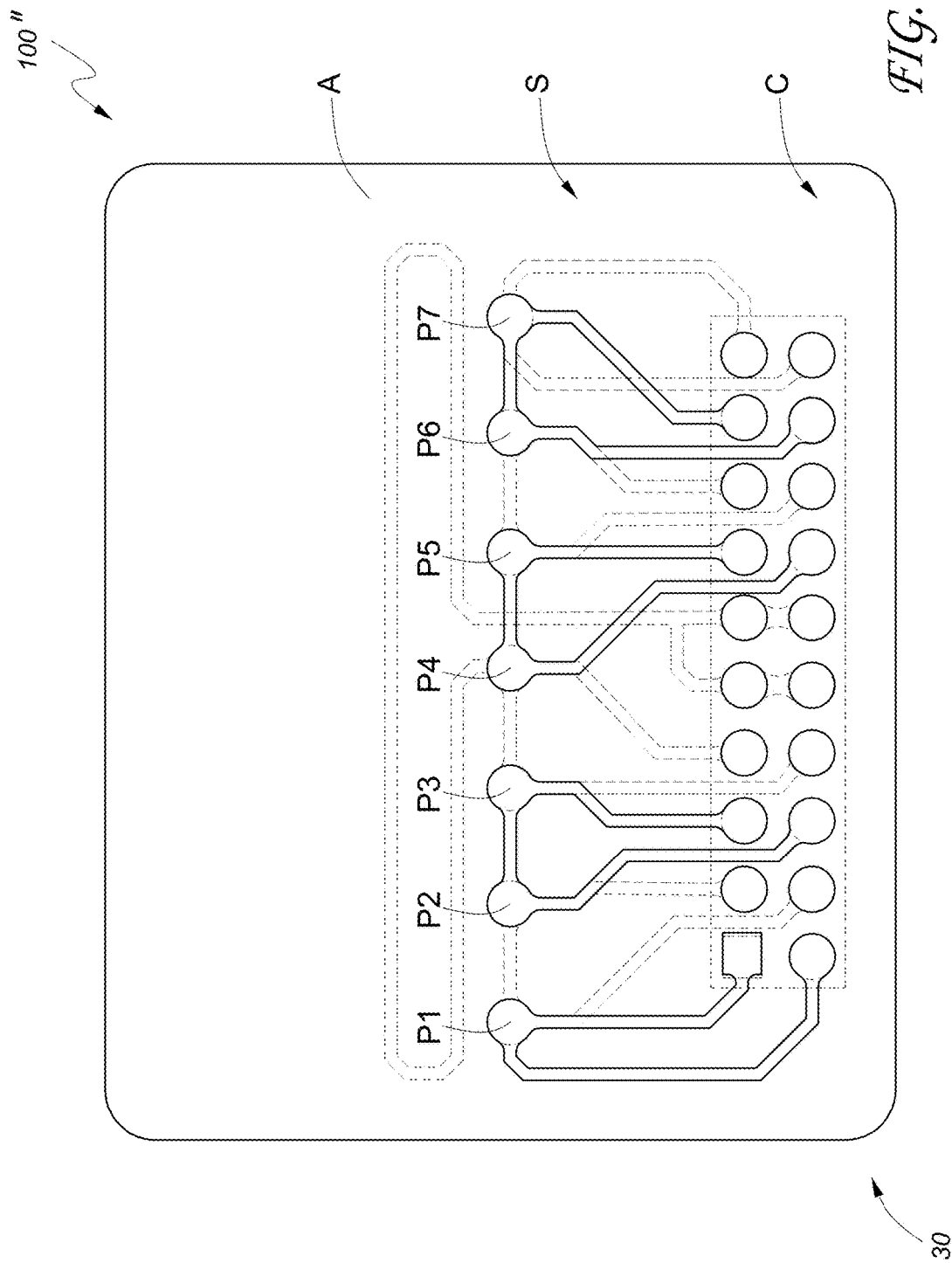

PRINTED CIRCUIT BOARD TEST COUPON FOR ELECTRICAL TESTING DURING THERMAL EXPOSURE AND METHOD OF USING THE SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The invention is directed to a printed circuit board (PCB) test coupon for use in electrical testing during thermal exposure, and more particularly to a PCB test coupon having a matrix of holes that can be electrically measured with a limited number of test channels

Description of the Related Art

Electrical testing of plated holes/vias (e.g., through, blind, buried, stacked) in double sided or multilayer printed circuit boards (PCB) to discover electrical reliability involves placing specifically designed test coupons into a thermal cycling environment that sequentially exposes them to hot and cold temperature extremes in cycles causing expansion and contraction of the plated hole/via with each thermal cycle. Sensing electrical failures due to fracturing or cracking of the plated holes/vias during thermal cycling historically involved making a test coupon consisting of an electrical test net containing more than one plated hole/via in a "daisy chain" pattern of plated holes/vias. The multiple plated holes/vias in this daisy chain test net were connected by copper trace patterns running between two plated holes/vias consecutively on alternating sides of the plated hole/via. Electrical resistance of the daisy chain test net of plated holes/vias was then measured using a 4-wire kelvin bridge measurement system to see if its resistance changed at a specified temperature during the thermal cycling. Resistance increases in the daisy chain test net at a specified temperature would indicate fracturing or cracking of the plated hole(s)/via(s) in the test net. Daisy chains are limited to detecting these fractures or cracks in an advanced stage, as the volume of copper in the plated hole is significantly greater that the volume of copper in the traces connecting them together in the daisy chain. Daisy chain test nets cannot electrically differentiate the degree of fractures or cracks in different/multiple plated holes/vias of the test net. Electrical resistance increases in the daisy chain detected by the 4-wire kelvin bridge measurement system at a given temperature during the thermal cycle would indicate that the volume of copper in one/some/all of plated hole(s)/via(s) had been reduced by fracture or cracking to a point where the difference between the volume of copper in the hole and volume of copper in the traces connecting them in the daisy chain was not significant enough to prevent detection. Detection from daisy chains would show evidence of fracturing or cracking of the copper in the plated hole(s)/via(s) at some indeterminate time after the initiation point of the fracture or crack.

In order to detect the initiation point of fracturing or cracking of a plated hole/via, the only solution is to forgo using daisy chain nets and measure a single plated hole/via in a test net for resistance change at a given temperature using a 4-wire kelvin measurement system. Testing of a single plated hole/via net in a PCB test coupon differs from testing a daisy chain net of plated holes/vias by being able to detect cracks or fractures in a plated hole/via as soon as they initiate. The disadvantage to this method is that it is difficult to get a statistically significant amount of plated holes/vias tested as each test net only provides information on one plated hole/via, whereas daisy chain test nets allow for resistance data to be collected from multiple plated holes/vias in one test net.

SUMMARY

Accordingly, there is a need for an improved PCB test coupon for use in electrical testing during thermal excursions that addresses one or more of the deficiencies in existing test coupons described above.

In accordance with one aspect of the disclosure, a PCB test coupon is provided having a matrix of plated holes/vias, where the resistance of the plated holes/vias in the matrix can be measured with a limited set of test channels to increase the amount of electrical resistance test data available from said limited set of test channels.

In accordance with another aspect of the disclosure, a PCB test coupon is provided having a matrix of seven to sixteen test nets, each containing a single plated hole/via or daisy chain of plated holes/vias that can be measured with a limited set of test channels that would normally test 4 daisy chain test nets not in a matrix configuration.

In accordance with another aspect of the disclosure a printed circuit board test coupon for electrical testing during thermal exposure is provided. The test coupon comprises a substrate having one or more conductive layers and extending between a first side and a second side opposite the first side. The test coupon also comprises a plurality of plated holes/vias formed within the substrate of the test coupon or extending through the entire substrate of the test coupon from a first surface on the first side A of the plated hole/via to a second surface on the second side B of the plated hole/via. The test coupon also comprises a second plurality of trace patterns defining a second pattern, each of the second plurality of trace patterns interconnecting a different subset of the plurality of holes/vias on the second side of the plated holes/vias, the second pattern being different than the first pattern. The test coupon further comprises a connector pattern defined within or on the surface of the substrate, the first and second plurality of trace patterns connected to a plurality of connection points in the connector pattern. A measurement of resistance of each plated hole/via is provided by connecting 2 wires of a 4-wire kelvin bridge measurement system to the first side and connecting 2 wires of a 4-wire kelvin bridge measurement system to the second, side of the plated hole/via using connection points for one of the first plurality of trace patterns and one of the second plurality of trace patterns that connect to said plated hole/via.

In accordance with another aspect of the disclosure, a printed circuit board test coupon for electrical testing during thermal exposure is provided. The test coupon comprises a substrate having one or more conductive layers and extending between a first side and a second side opposite the first side. The test coupon also comprises a plurality of plated holes/vias comprising seven to sixteen plated holes/vias formed within the substrate of the test coupon or extending through the entire substrate of the test coupon from a first surface on the first side of the plated hole/via to a second surface on the second side of the plated hole/via. The test coupon also comprises a first plurality of trace patterns defining a first pattern comprising four trace patterns on the first side, each of the four trace patterns interconnecting four of the plated holes/vias on the first side of the plated holes/vias. The test coupon also comprises a second plurality of trace patterns defining a second pattern comprising four trace patterns on the second side, each of the four trace patterns interconnecting plated holes/vias on the second side of the plated hole/via, the second pattern being different than the first pattern and each of the sixteen plated holes/vias connecting to one of the trace patterns on the first side and one of the trace patterns on the second side of the via. The test coupon further comprises a connector pattern defined in the substrate having twenty connection points, the first and second plurality of trace patterns connected to the twenty connection points in the connector pattern. A measurement of resistance of each of the sixteen plated holes/vias is provided by connecting 2 wires each of a 4-wire kelvin bridge measurement system to the first and second sides of the plated hole/via using connection points in the connector pattern for one of the first plurality of trace patterns and one of the second plurality of trace patterns that connect to said plated hole/via.

In accordance with another aspect of the disclosure, a method of making a printed circuit board test coupon for electrical testing during thermal exposure is provided. The method comprises forming a substrate having one or more conductive layers and extending between a first side and a second side opposite the first side, and forming a plurality of plated holes/vias within the substrate of the test coupon or such that they extend through the entire substrate of the test coupon from a first surface on the first side of the plated hole/via to a second surface on the second side of the plated hole/via. The method further comprises forming a first plurality of trace patterns in a first pattern, each of the first plurality of trace patterns interconnecting a subset of the plurality of plated holes/vias on the first side of the substrate, and forming a second plurality of trace patterns in a second pattern different than the first pattern, each of the second plurality of trace patterns interconnecting a different subset of the plurality of vias on the second side of the plated hole/via. The method further comprises providing a connector pattern in the substrate having a plurality of connection points, the first and second plurality of trace patterns connected to the plurality of connection points. A resistance measurement of each plated hole/via is provided by connecting 2 wires of a 4-wire kelvin bridge measurement system to the first side and connecting 2 wires of a 4-wire kelvin bridge measurement system to the second side of the plated hole/via using connection points for one of the first plurality of trace patterns and one of the second plurality of trace patterns that connect to said plated hole/via.

In accordance with another aspect of the disclosure, a printed circuit board test coupon for electrical testing during thermal exposure is provided. The test coupon comprises a substrate having one or more conductive layers and extending between a first side and a second side opposite the first side. The test coupon also comprises a plurality of plated holes/vias formed within the substrate of the test coupon or extending through the entire substrate of the test coupon from a first surface on the first side A of the plated hole/via to a second surface on the second side B of the plated hole/via. The test coupon also comprises a first plurality of trace patterns defining a first pattern, each of the first plurality of trace patterns interconnecting a subset of the plurality of plated holes/vias on the first side of the plated holes/vias. The test coupon also comprises a second plurality of trace patterns defining a second pattern, each of the second plurality of trace patterns interconnecting a different subset of the plurality of holes/vias on the second side of the plated holes/vias, the second pattern being different than the first pattern. The test coupon also comprises a connector pattern defined within or on the surface of the substrate, the first and second plurality of trace patterns connected to a plurality of connection points in the connector pattern. A measurement of resistance of each plated hole/via is provided by connecting 2 wires of a 4-wire kelvin bridge measurement system to the first side and connecting 2 wires of a 4-wire kelvin bridge measurement system to the second, side of the plated hole/via using connection points for one of the first plurality of trace patterns and one of the second plurality of trace patterns that connect to said plated hole/via.

In accordance with another aspect of the disclosure, a printed circuit board test coupon for electrical testing during thermal exposure is provided. The test coupon comprises a substrate having one or more conductive layers and extending between a first side and a second side opposite the first side. The test coupon also comprises a plurality of plated holes/vias comprising seven plated holes/vias formed within the substrate of the test coupon or extending through the entire substrate of the test coupon from a first surface on the first side of the plated hole/via to a second surface on the second side of the plated hole/via. The test coupon also comprises a first plurality of trace patterns defining a first pattern comprising four trace patterns on the first side, each of the four trace patterns connecting to at least one of the plated holes/vias on the first side of the plated holes/vias. The test coupon also comprises a second plurality of trace patterns defining a second pattern comprising four trace patterns on the second side, each of the four trace patterns connecting to at least one of the plated holes/vias on the second side of the plated holes/vias, the second pattern being different than the first pattern and each of the seven plated holes/vias connecting to one of the trace patterns on the first side and one of the trace patterns on the second side. The test coupon also comprises a connector pattern defined in the substrate having twenty connection points, the first and second plurality of trace patterns connected to the twenty connection points in the connector pattern. A measurement of resistance of each of the seven plated holes/vias is provided by connecting 2 wires each of a 4-wire kelvin bridge measurement system to the first and second sides of the plated hole/via using connection points in the connector pattern for one of the first plurality of trace patterns and one of the second plurality of trace patterns that connect to said plated hole/via.

In accordance with another aspect of the disclosure, a method of testing a test coupon is provided. The method comprises inserting the test coupon into a test machine, varying a temperature of a fluid toward a first temperature, exposing the test coupon to the fluid at the first temperature, varying a temperature of the fluid toward a second temperature, and exposing the test coupon to the fluid at the second temperature.

In accordance with another aspect of the disclosure, a method of testing a test coupon is provided. The method comprises inserting the test coupon into a test machine, stabilizing the test coupon at a first temperature, measuring a first resistance of the test coupon at the first temperature, stabilizing the test coupon at a second temperature different than the first temperature, measuring a second resistance of the test coupon at the second temperature, and determining a failure of the test coupon from one or both of the first and second resistance measurements.

BRIEF DESCRIPTION OF THE DRAWINGS

FIG. 9B is a schematic view of an array of a test coupon 100" with trace patterns T on both sides of a laminated PCB test coupon substrate S (e.g. external or internal layers of a multilayer PCB test coupon) superimposed on each other, with the trace patterns T on the second side of the laminated PCB test coupon substrate S shown in phantom. The integrated circular pads P (1-7) of the trace patterns T are attached to and terminate side A of plated holes/vias H (1-7). The ends of each trace pattern T terminate in 2 pads C of connector pattern 30 which is comprised of pads C1-C20. Each of the pads C in connector pattern 30 has a plated through hole associated with it that facilitates connection of the 4-wire kelvin bridge measurement system to a test coupon 100".

DETAILED DESCRIPTION

Figure 1:
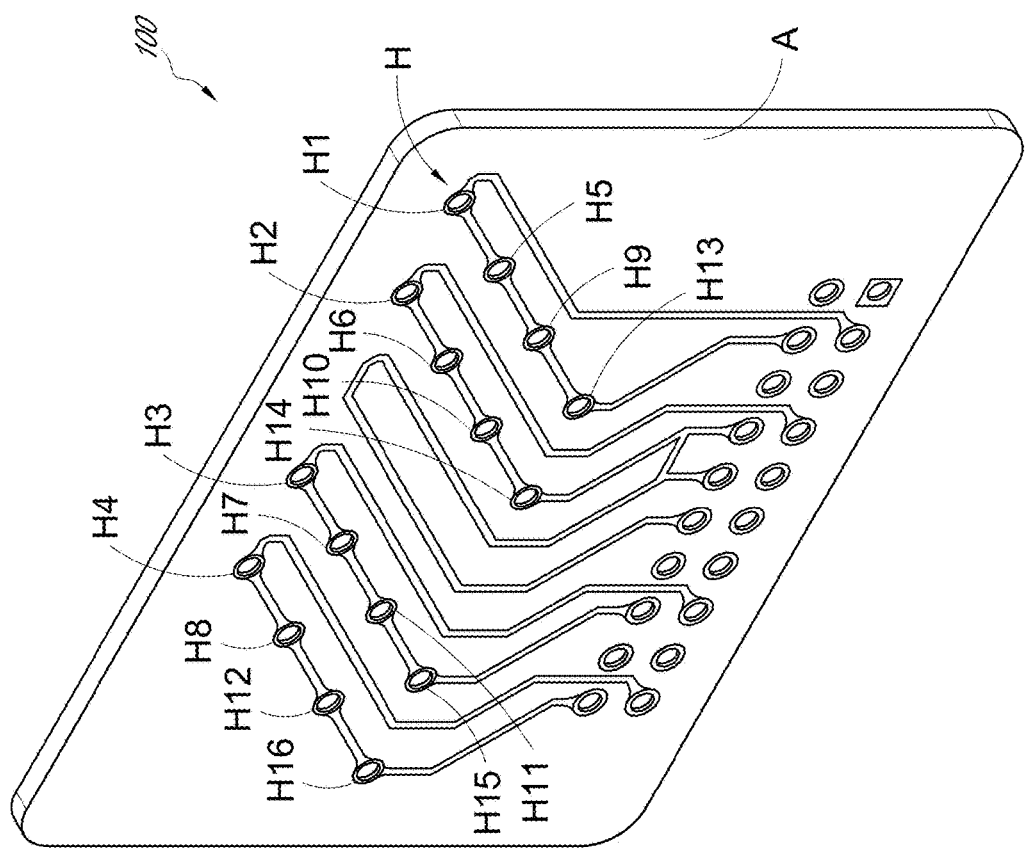
FIG. 1 is perspective schematic view of a first side A of a test coupon 100 or the internal substrate layers of a multilayer PCB test coupon.
Figure 2:
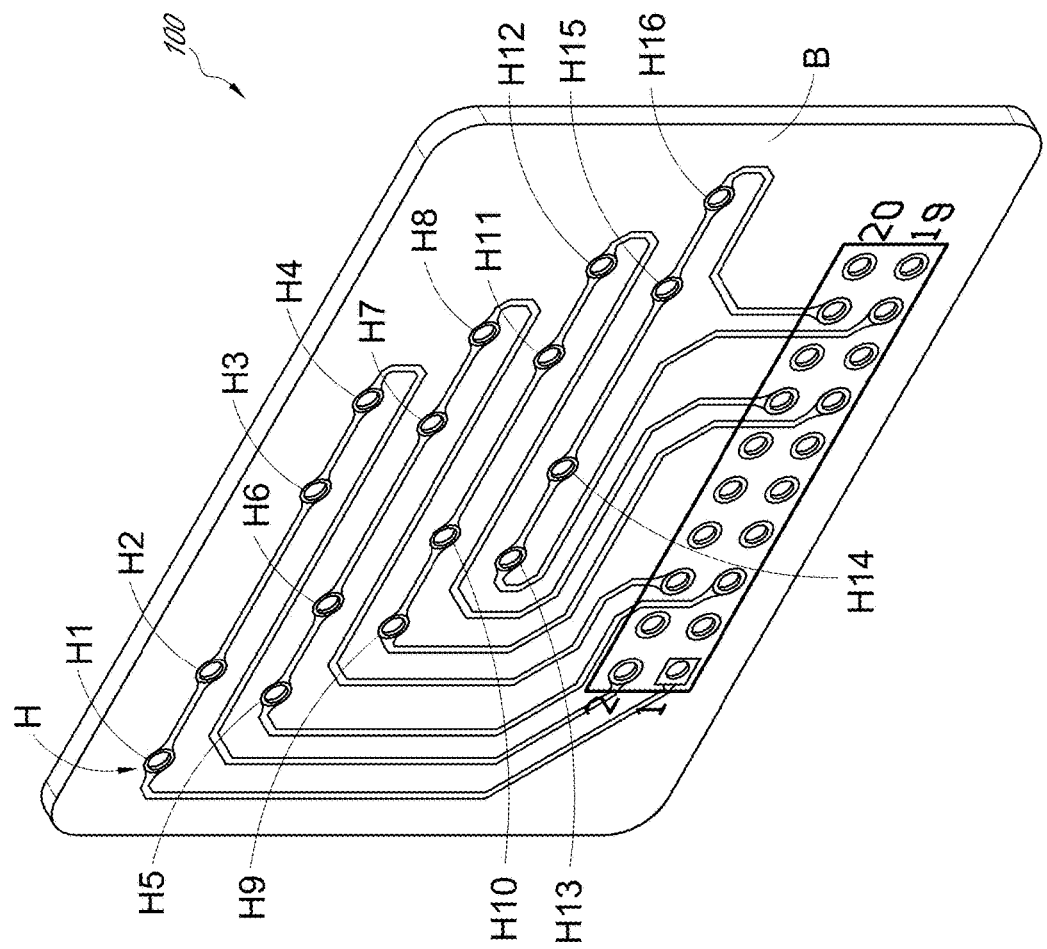
FIG. 2 is a perspective schematic view of a second side B of the test coupon 100 or the internal substrate layers of a multilayer PCB test coupon in FIG. 1.

FIGS. 1-2 show a printed circuit board (PCB) test coupon 100 or the internal layers of a multilayer PCB test coupon for use in electrical testing during thermal exposure. Thermal exposure includes cycling the test coupon 100 between extreme temperatures (e.g., extreme low temperature and extreme high temperature), for example by flowing a fluid (e.g., air) at different temperatures past the test coupon 100 and sensing the resistance of various components of the test coupon 100 through the connector pattern 30.

The test coupon 100 can be made using the same process used to manufacture the final printed circuit boards which they represent and can have substrate S with plated holes/vias (blind, buried, stacked, through) H, multiple conductive layers, and trace patterns T (e.g., made of copper or other conductive material) that connect to either side of the plated holes/vias H using pads P.

Figure 3:
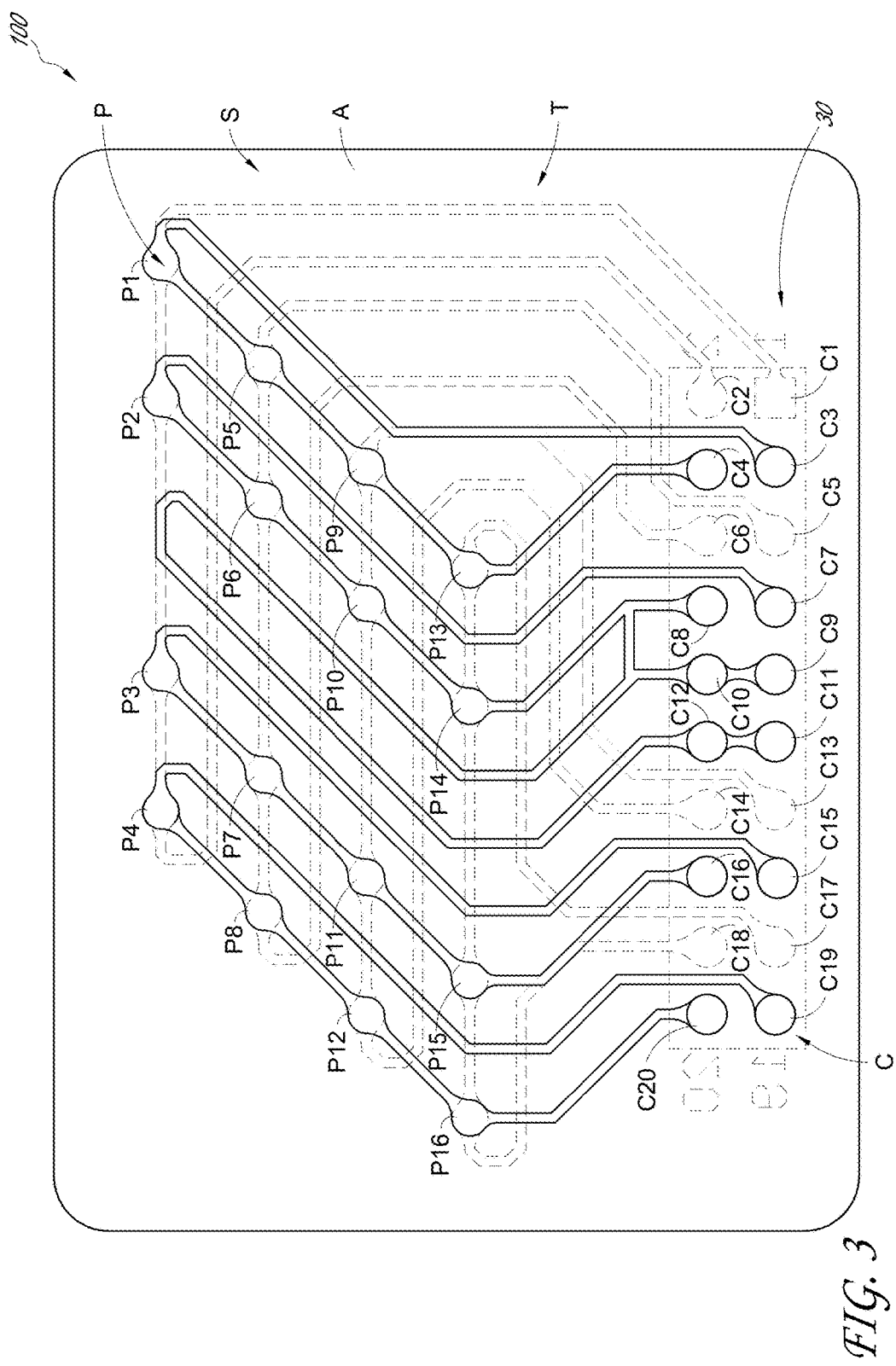
FIG. 3 is a schematic view of an array of trace patterns T on both sides of the laminated PCB test coupon substrate S (e.g. external or internal layers of a multilayer PCB test coupon) of FIGS. 1-2 superimposed on each other, with the trace patterns T on the second side of the laminated PCB test coupon substrate S shown in phantom. The integrated circular pads P (1-16) of the trace patterns T are attached to and terminate side A of the plated holes/vias H (1-16). The ends of each trace pattern T terminate in 2 pads C of connector pattern 30 which is comprised of pads C1-C20. Each of the pads C in connector pattern 30 has a plated through hole associated with it that facilitates connection of the 4-wire kelvin bridge measurement system to the test coupon 100.
Figure 4:
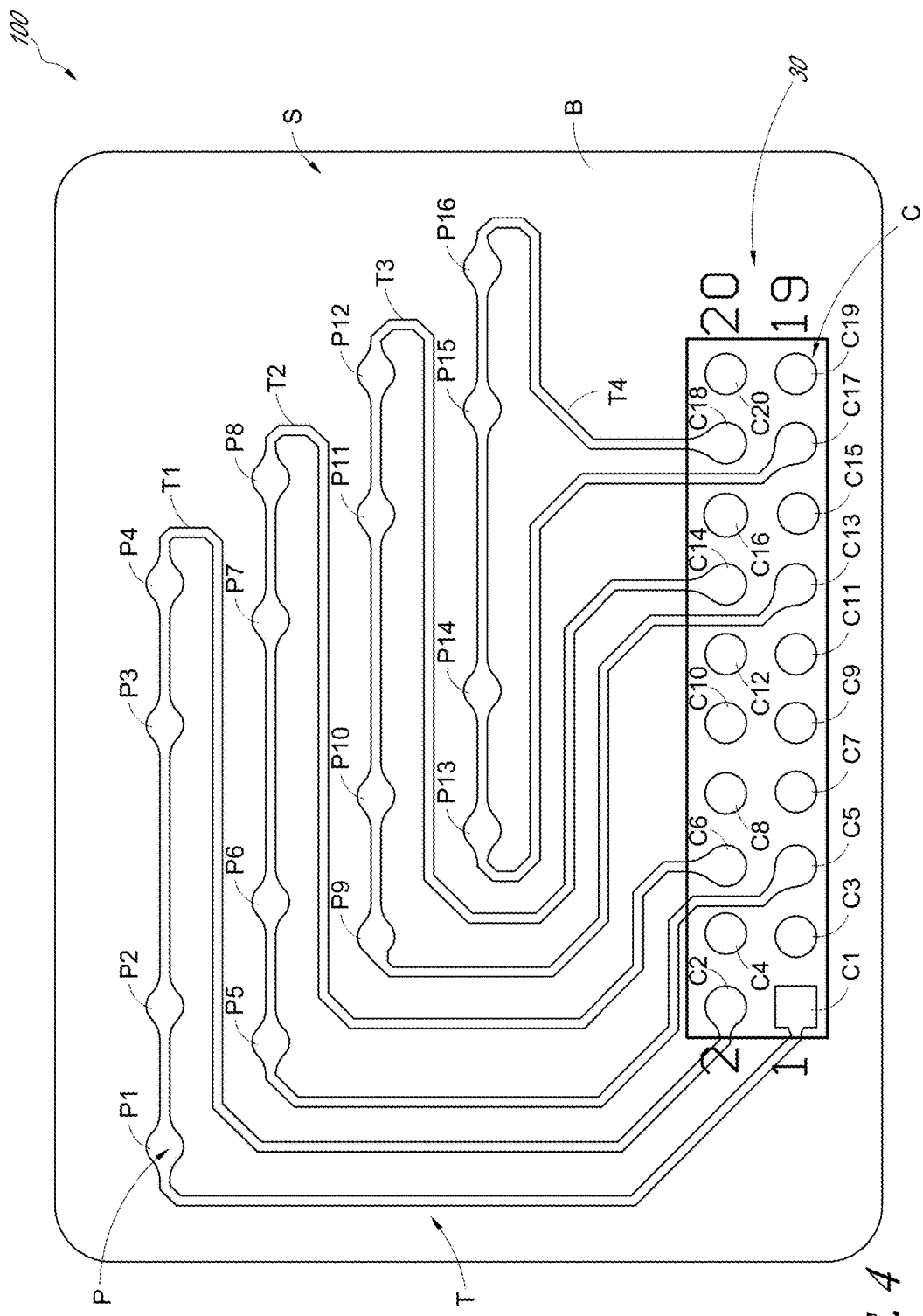
FIG. 4 is a schematic view of trace patterns T1-T4 on the second side of the laminated PCB test coupon substrate S (e.g. external or internal layer of a multilayer PCB test coupon) of FIGS. 1-2. The integrated circular pads P (1-16) of these trace patterns T are attached to and terminate side B of the plated holes/vias H (1-16). The ends of each trace pattern T1-T4 terminate in 2 pads C of connector pattern 30 which is comprised of pads C1-C20. Each of the pads C in connector pattern 30 has a plated through hole associated with it that facilitates connection of the 4-wire kelvin bridge measurement system to the test coupon 100.
Figure 5:
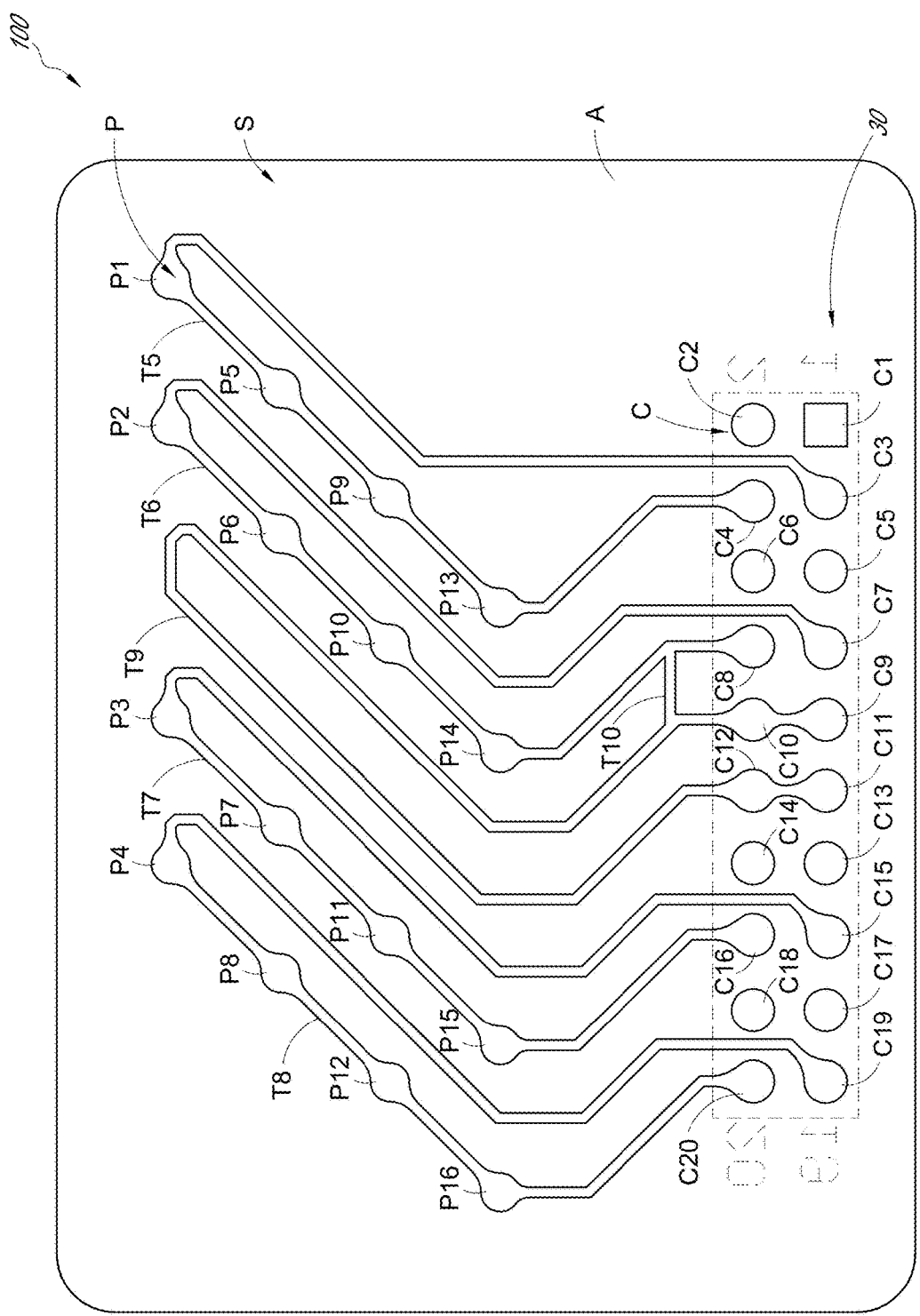
FIG. 5 is a schematic view of trace patterns T5-T10 on the first side of the laminated PCB test coupon substrate S (e.g. external or internal layer of a multilayer PCB test coupon) of FIGS. 1-2. The integrated circular pads P (1-16) of these trace patterns are attached to and terminate side A of the plated holes/vias H (1-16). The ends of each trace pattern T5-T8 terminate in 2 pads C of connector pattern 30 which is comprised of pads C1-C20. The ends of each trace pattern T9-T10 terminate in 4 pads C of connector pattern 30 which is comprised of pads C1-C20. Each of the pads C in connector pattern 30 has a plated through hole associated with it that facilitates connection of the 4-wire kelvin bridge measurement system to the test coupon 100.

With continued reference to FIGS. 1-2, the test coupon 100 has an array of sixteen plated holes/vias H (1-16) that extend either through the entire test coupon 100 or between internal layers of a multilayer test coupon from side A (a first side) to an opposite side B (a second side) of the test coupon or internal layers of a multilayer test coupon 100. The test coupon 100 has a plurality of trace patterns T arranged to attach to multiple plated holes/vias H through pads P in trace patterns T from each side of the plated hole/via, as shown in FIGS. 3-5. The test coupon 100 has a connector pattern 30 with multiple plated through hole connection points C for electrical contacts, for example twenty connection points (e.g., C1, C2, C3, C4, C5, . . . C18, C19, C20) to which the ends of the trace patterns T connect.

The trace patterns T viewed from side A of the substrate S differs from the trace patterns T viewed from the opposite side B of substrate S. Pads P in each trace pattern on side A connects to a different group of plated holes/vias H, and pads P on each trace pattern on side B connects to a different group of plated holes/vias H, each pad P with a plated hole/via H connecting to one of the trace patterns on side A and one of the trace patterns on side B of substrate S.

As shown in FIG. 4, on side B of the test coupon 100, a trace pattern T1 and its associated pads P (1-4) connect to one side of the associated plated holes/vias H (1-4) and terminates into connection points C1 and C2, trace pattern T2 and its pads P (5-8) connect to one side of the associated plated holes/vias H (5-8) and terminates into connection points C5 and C6, trace pattern T3 and its pads P (9-12) connect to one side of the associated plated holes/vias H (9-12) and terminates into connection points C13 and C14, and trace pattern T4 and its pads P (13-16) connects to one side of the associated plated holes/vias H (13-16) and terminates into connection points C17 and C18. Trace pattern T1-T4 and their pads P (1-16) connect one side of the plated holes/vias H (1-16) on side B via a substantially horizontal path (e.g., paths that extend generally parallel to an upper edge and/or a lower edge of the test coupon 100).

With reference to FIG. 5, on side A of the substrate S, a trace pattern T5 and its pads P (1, 5, 9 and 13) connect to one side of the associated plated holes/vias H (1, 5, 9 and 13) and terminates into connection points C3 and C4, trace pattern T6 and its pads P (2, 6, 10 and 14) connect to one side of the associated plated holes/vias H (2, 6, 10 and 14) and terminates into connection points C7 and C8, trace pattern T7 and its pads P (3, 7, 11 and 15) connect to one side of the plated holes/vias H (3, 7, 11 and 15) and terminates into connection points C15 and C16, and trace pattern T8 and its pads P (4, 8, 12 and 16) connect to one side of the plated holes/vias H (4, 8, 12 and 16) and terminates into connection points C19 and C20. Trace patterns T5-T8 and their pads P (1-16) connect one side of the associated plated holes/vias H (1-16) on side A via a substantially angled path (e.g., paths that extend at a non-parallel and non-perpendicular angle to an upper edge and/or a lower edge of the test coupon 100).

Trace pattern T9 does not connect to any tested plated holes/vias and terminates into connection points C9, C10, C11 and C12 and can be used for calculating the temperature of the side A surface of the substrate S. Copper conductors have a predictable resistance change with temperature, so trace T9 allows the generation of a resistance to temperature correlation profile for surface A of substrate S by measuring the resistance of that circuit (e.g., trace T9), at different temperatures during calibration or exposure of the test coupon 100 to thermal cycles to calculate the side A surface temperature of the substrate S associated with that circuit.

Trace pattern T10 extends between trace pattern T6 and trace pattern T9. The resistance of trace pattern T10 can be measured by connecting the two wires (electrodes) of the kelvin bridge measurement system to connection points C7 and C8 (endpoints of trace pattern T6) of the test coupon 100 and connecting the other two wires (electrodes) of the kelvin bridge measurement system to connection points C9 and C10 (endpoints of trace pattern T9) of the test coupon 100. The measurement of the trace pattern T10 generally should always be the same at any specified temperature and can provide a reference resistance (e.g., for calibration) in a range similar to the resistance range of the plated hole/via to evaluate the consistency and drift of the resistance measurements made of the plated holes/vias using the kelvin bridge measurement system (e.g., drift of components in the meter/switching/interconnection systems). Such a reference resistance can be used to monitor and compensate for electrical drift in the kelvin bridge measurement system during electrical testing of the nets in test coupon 100 during thermal exposure. During thermal exposure of the test coupon 100, as the holes or vias H in pads P may fracture or crack causing the measured resistance of the test net to increase at a specified temperature. Though the reference resistance of the trace pattern T10 should remain the same at a specified temperature, one or more of the components of the kelvin bridge measurement system may be sensitive to temperature or other environmental changes, which may result in drift in the repeated resistance measurement of the trace pattern T10 at a specified temperature. Advantageously, the measurement system can compensate for drift by using changes in the resistance measurement of the trace pattern T10 at a specified temperature (e.g., as it applies to the resistance measurements of one of the plated holes/vias).

Optionally, one or more of the plated holes/vias H (1-16) placed in pads P (1-16) on the associated trace patterns can vary in one or more characteristics, such as via diameter, pad diameter, trace pattern width, grid size and connect sequence that mimics the PCB structure evaluated using test coupon 100. In other embodiments, the plated holes/vias H (1-16) can vary by via type (e.g., through, blind, buried, stacked) and be internal or external to the substrate S.

The test coupon 100 provides a matrix for testing made up of 20 individual connection points C1-C20 in the connector pattern 30 and allows for the individual resistance measurement of each of the plated holes/vias H (1-16) associated with pads P (1-16). In order to make a resistance measurement of one of the plated holes/vias H, 2-wires of the 4-wire kelvin bridge measurement system are attached to the endpoints associated with the trace pattern of side A connected to the hole H under test and the other 2-wires of the 4-wire kelvin bridge measurement system are attached to the endpoints associated with the trace pattern of side B connected to the hole H under test of the test net. For example, to measure the resistance of plated hole/via H1 associated with pad P1, two electrodes of the kelvin bridge measurement system are connected to connection points C1 and C2 of the test coupon 100 to form one side of the kelvin bridge test circuit (e.g., via trace pattern T1 on side B), and the other two electrodes of the kelvin bridge measurement system are connected to connection points C3 and C4 of the test coupon 100 to form the second side of the kelvin bridge test circuit (e.g., via trace pattern T5 on side A). The connections of the electrodes of the kelvin bridge measurement system to these connection points C1, C2, C3 and C4 isolate the plated hole/via H1 associated with pad P1 from the rest of the plated holes/vias so that only the resistance of plated hole/via H1 is measured. Since the plated hole/via H1 associated with pad P1 is the common hole between the pads of the two measurement patterns (e.g., defined in part by trace patterns T1 and T5) on either side of the plated hole/via H1, the resistance of plated hole/via H1 is what is measured when the electrodes of the kelvin bridge measurement system are connected to connection points C1, C2 and the other two electrodes of the kelvin bridge measurement system are connected to connection points C3, C4 of the test coupon 100. Advantageously, each plated hole/via net connects to two connection points C on the connector pattern 30 via a single trace pattern T on side A, and connects to two different connection points C on the connector pattern 30 via a single trace pattern T on side B of the test coupon 100, as further described in below.

Table 1 below identifies the measurement scheme for the test coupon 100 shown in FIGS. 1-5. Specifically, Table 1 lists the connection points C in the connector pattern 30 of the test coupon 100 that connects two of the four wires (e.g., electrodes) of the 4-wire kelvin bridge measurement system to the side A trace patterns, and the connection points C in the connector pattern 30 that connects the other two wires (e.g., electrodes) of the 4-wire kelvin bridge measurement system to side B trace patterns, in order to test (e.g., measure the resistance of) each net consisting of a plated hole/via H, temperature net and the calibration/drift net.

TABLE 1

Measurement Scheme for PCB Test Coupon 100

| Test Net | Kelvin Bridge Connection Points to Trace Pattern Side A | Kelvin Bridge Connection Points to Trace Pattern Side B |
| --- | --- | --- |
| Plated Hole/Via H1 | C1 & C2 | C3 & C4 |
| Plated Hole/Via H2 | C1 & C2 | C7 & C8 |
| Plated Hole/Via H3 | C1 & C2 | C15 & C16 |
| Plated Hole/Via H4 | C1 & C2 | C19 & C20 |
| Plated Hole/Via H5 | C5 & C6 | C3 & C4 |
| Plated Hole/Via H6 | C5 & C6 | C7 & C8 |
| Plated Hole/Via H7 | C5 & C6 | C15 & C16 |
| Plated Hole/Via H8 | C5 & C6 | C19 & C20 |
| Plated Hole/Via H9 | C13 & C14 | C3 & C4 |
| Plated Hole/Via H10 | C13 & C14 | C7 & C8 |
| Plated Hole/Via H11 | C13 & C14 | C15 & C16 |
| Plated Hole/Via H12 | C13 & C14 | C19 & C20 |
| Plated Hole/Via H13 | C17 & C18 | C3 & C4 |
| Plated Hole/Via H14 | C17 & C18 | C7 & C8 |
| Plated Hole/Via H15 | C17 & C18 | C15 & C16 |
| Plated Hole/Via H16 | C17 & C18 | C19 & C20 |
| Temperature | C9 & C10 | C11 & C12 |
| Calibration/Drift | C9 & C10 | C7 & C8 |

In the test coupon 100 of FIGS. 1-5, each of the sixteen plated holes/vias connects to a separate test net. Two additional test nets are provided to measure surface temperature and calibration/drift (via trace patterns T9 and T10), as discussed above. Advantageously, the routing of the trace patterns T on the substrate S (e.g., trace patterns T1-T4 on side A and trace patterns T5-T8 on side B) allow each of the sixteen plated holes/vias and the two reference conductors (for surface temperature and calibration/drift) to be measured via only 20 connections points (i.e., C1-C20). Therefore, the test coupon 100 increases the amount of electrical test net data available from thermal exposure of test coupon 100, using a matrix of 20 nets that can be measured with only 20 connections that would normally test four daisy chain test nets if a matrix is not used.

In use, the connector pattern 30 of test coupon 100 is attached to a connection system of a thermal exposure and electrical testing machine. The connection system in the machine interfaces with the connector pattern 30 of the test coupon 100. The machine can have an matrix switch to facilitate the connection of four test pattern inputs associated with each test net matrixing connection points C from test coupon 100 to the four inputs of the kelvin bridge measurement system (e.g., connect two wires of the 4-wire kelvin bridge measurement system to two connection points C of test coupon 100 connected to a trace pattern on side A of the substrate S and connect two wires of the 4-wire kelvin bridge measurement system to two connection points C of test coupon 100 connected to a trace pattern on side B of the substrate S). Therefore, operation of the array switch will connect the four inputs of the 4-wire kelvin bridge measurement system to four connection points C (two connected with a trace pattern on side A and two connected to a trace pattern on side B of substrate S) to measure the resistance of one net containing a plated hole/via (e.g., one of the sixteen plated holes/vias). The test coupon 100 is subjected to thermal exposure in the machine to test the electrical reliability of the test coupon 100 (e.g., of each of the holes/vias). During thermal exposure and electrical testing, stresses on the holes or vias due to the thermal exposure, can cause one or more plated holes/vias to fracture or crack and resistance measurements to increase at a specified temperature. Therefore, by measuring resistance of each of the plated holes/vias at a specified temperature during thermal exposure allows for collection of data on the reliability of each of the plated holes/vias.

Figure 6:
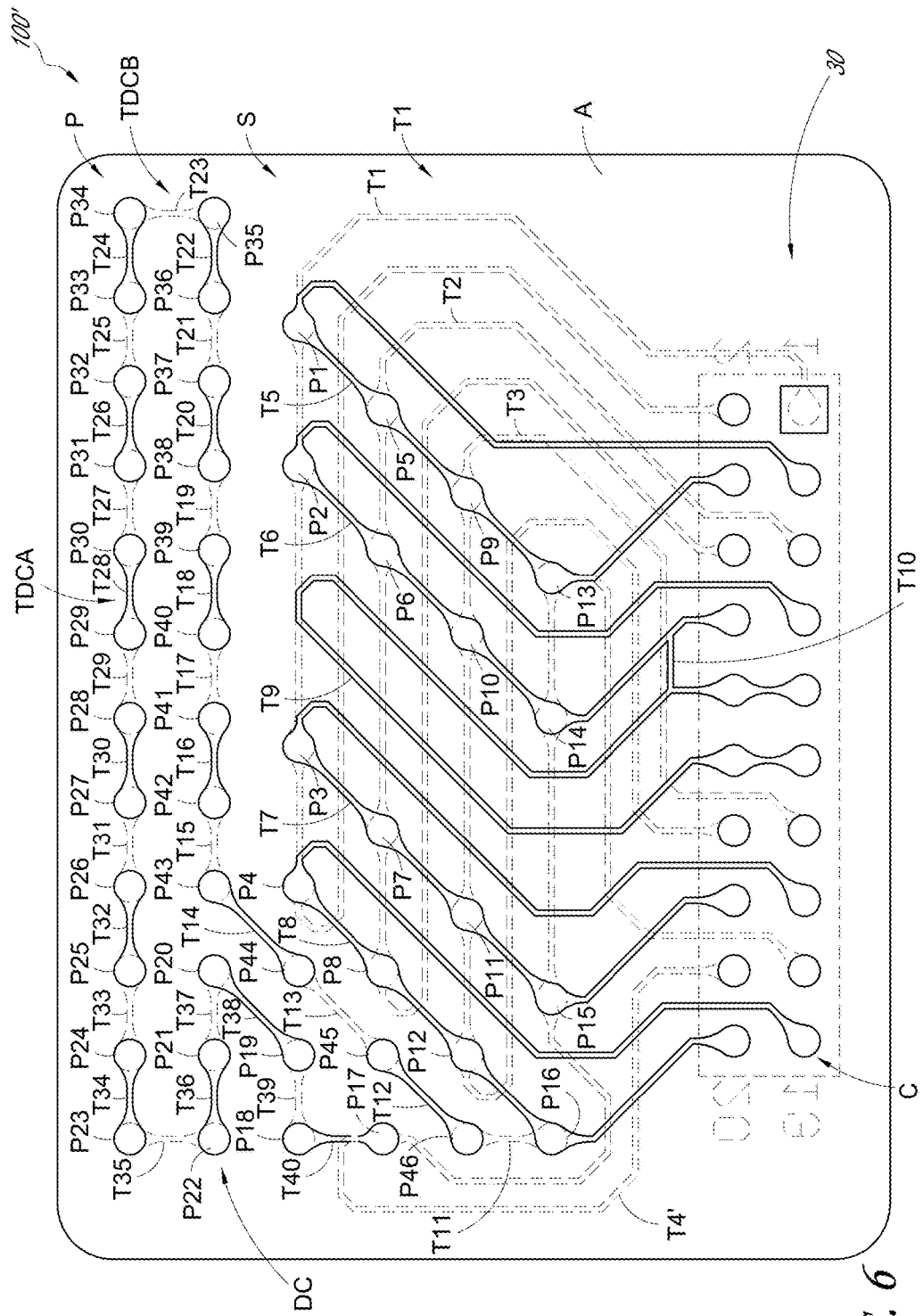
FIG. 6 is a schematic view of trace patterns on both sides of a laminated PCB test coupon substrate S (e.g. external or internal layers of a multilayer PCB test coupon) superimposed on each other, with the trace patterns on the second side of the laminated PCB test coupon substrate S (e.g. external or internal layer of a multilayer PCB test coupon) shown in phantom.
Figure 7:
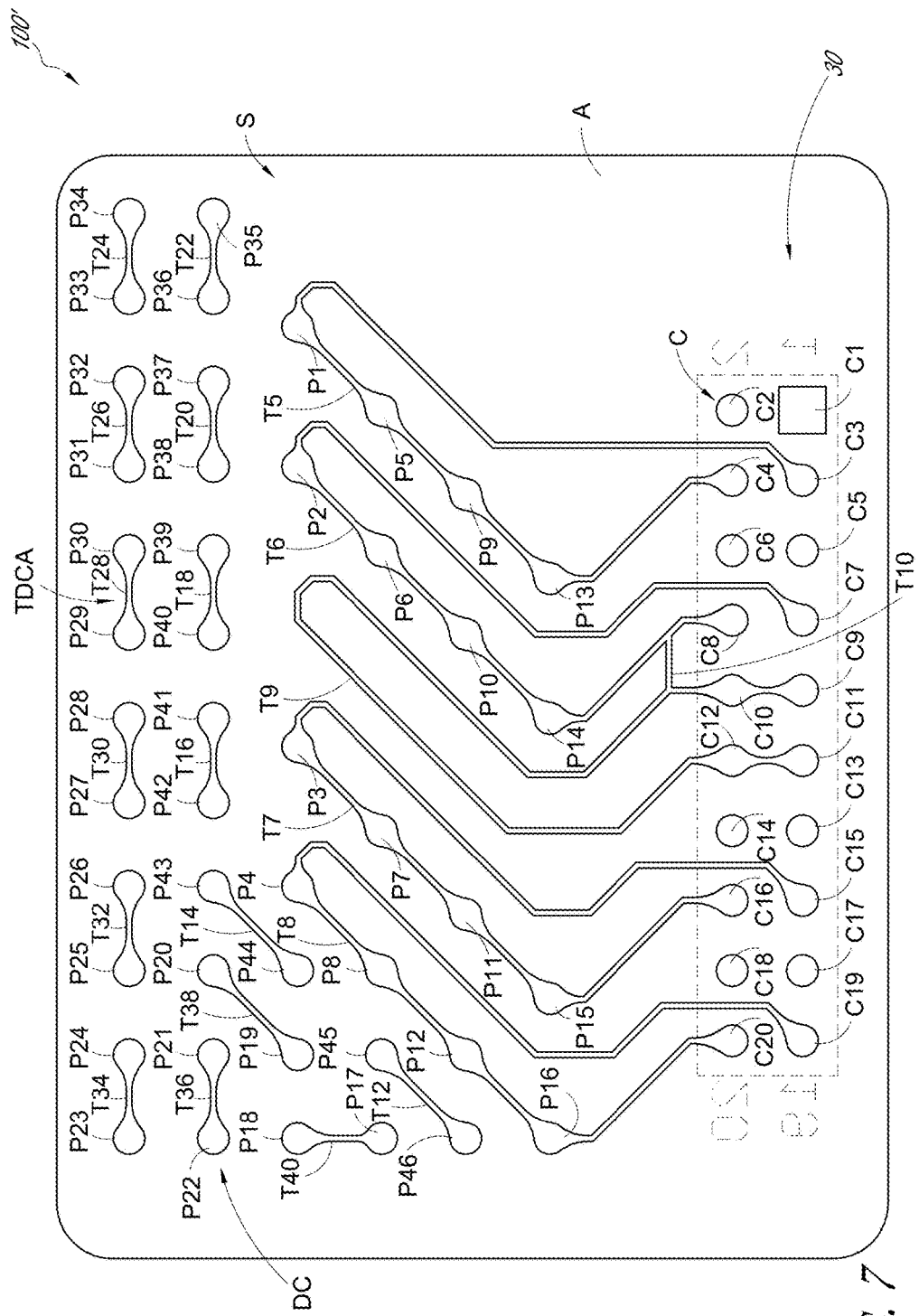
FIG. 7 is a schematic view of trace patterns T5-T10 and TDCA on a first side A of the laminated PCB test coupon substrate S (e.g. external or internal layer of a multilayer PCB test coupon) of FIG. 6. The integrated circular pads P (1-46) of these trace patterns T are attached to and terminate side A of the associated plated holes/vias. The ends of trace patterns T5-T8 terminate in 2 pads C of connector pattern 30 which is comprised of pads C1-C20. The ends of trace patterns T9-T10 terminate in 4 pads C of connector pattern 30 which is comprised of pads C1-C20. Each of the pads C in connector pattern 30 has a plated through hole associated with it that facilitates connection of the 4-wire kelvin bridge measurement system to the test coupon. The pads P (16-46) associated with TDCA trace pattern are attached to and terminate side A of the associated plated holes/vias. The trace pattern TDCA connects plated hole/via pairs together on side A (e.g., 19 & 20) which are then consecutively joined together to adjacent connected pairs (e.g., 21 & 22) with trace pattern TDCB (20 & 21) on side B to form a daisy chain net.
Figure 8:
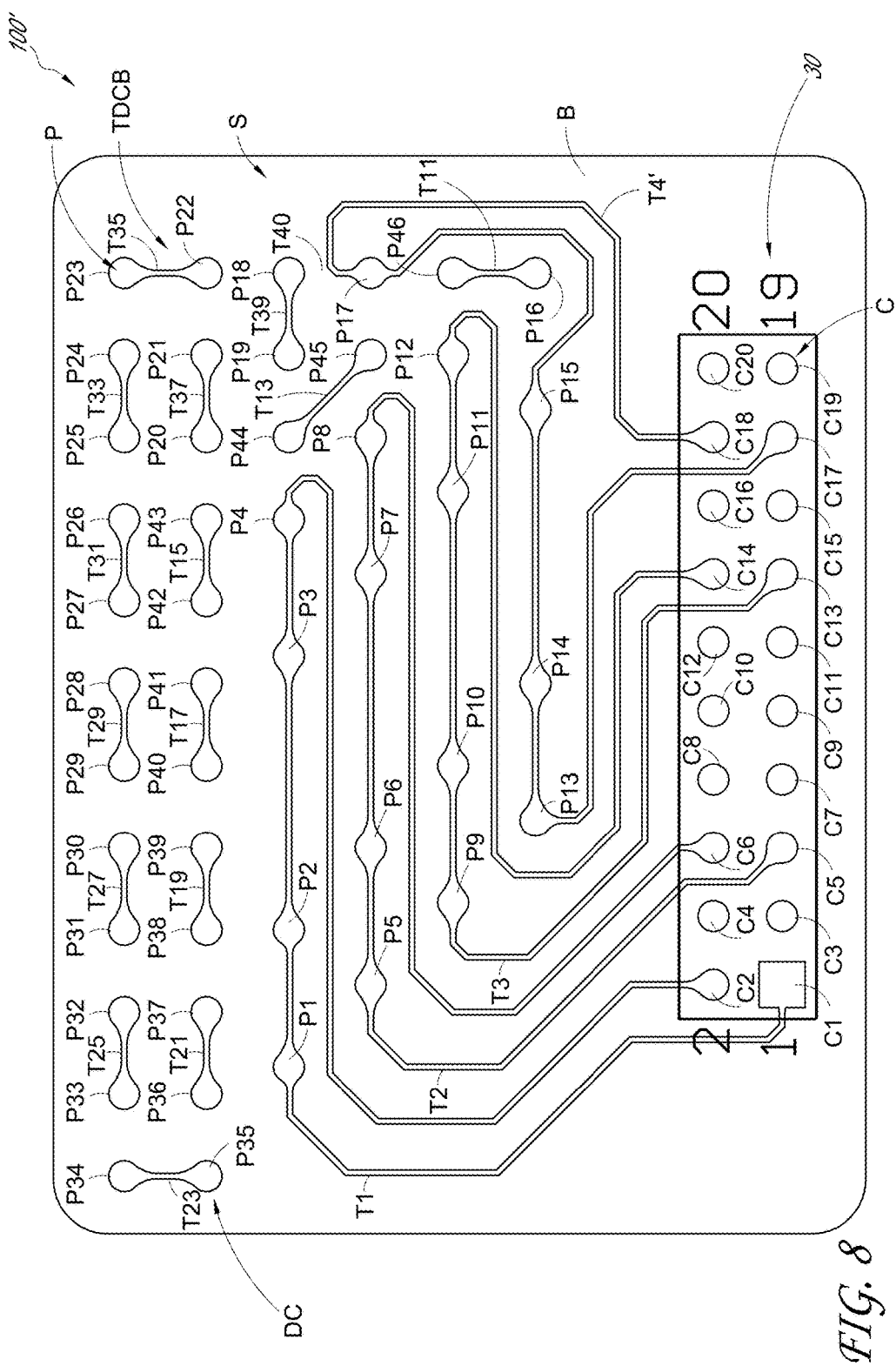
FIG. 8 is a schematic view of trace patterns T1-T4 and TDCB on a second side B of the laminated PCB test coupon substrate S (external or internal layer of a multilayer PCB test coupon) of FIG. 6 that is opposite the first side A. The integrated circular pads P (1-46) of these trace patterns T are attached to and terminate side B of the associated plated holes/vias. The ends of trace patterns T1-T4 terminate in 2 pads C of connector pattern 30 which is comprised of pads C1-C20. Each of the pads C in connector pattern 30 has a plated through hole associated with it that facilitates connection to the 4-wire kelvin bridge measurement system. The pads P (16-46) associated with TDCB trace pattern are attached to and terminate side B of the associated plated holes/vias. The trace pattern TDCB connects plated hole/via pairs together on side B (e.g. 22 & 23) which are then consecutively joined together to adjacent connected pairs (e.g. 24 & 25) with trace pattern TDCA (e.g. 23 & 24) on side A to form a daisy chain test net.

FIGS. 6-8 schematically illustrates a test coupon 100'. Some of the features of the test coupon 100' are similar to features of the test coupon 100 in FIGS. 1-5. Thus, references numerals used to designate the various components of the test coupon 100' are identical to those used for identifying the corresponding components of the test coupon 100 in FIGS. 1-5, except that a "'" has been added to the numerical identifier. Therefore, the structure and description for the various features of the test coupon 100 in FIGS. 1-5 are understood to also apply to the corresponding features of the test coupon 100' in FIGS. 6-8, except as described below.

The test coupon 100' differs from the test coupon 100 in the shape of the trace pattern T4', and in that the test coupon 100' includes a daisy chain DC of plated holes/vias interconnected by trace pattern TDCA and TDCB. Trace pattern TDCA is defined by trace segments T12, T14, T16, T18, T20, T22, T24, T26, T28, T30, T32, T34, T36, T38 and T40, each trace segment connecting two plated holes on side A. Trace pattern TDCB is defined by trace segments T11, T13, T15, T17, T19, T21, T23, T25, T27, T29, T31, T33, T35, T37 and T39, each trace segment connecting two plated holes on side B. The trace segments of trace pattern TDCA on side A alternate with trace segments of trace pattern TDCB on side B of test coupon 100', creating a daisy chain of interconnected plated holes/vias. The end points of the daisy chain DC (pads P16 and P17) terminate into connection points C17, C18, C19 and C20 via trace patterns T8 and T4. During thermal exposure, the electrical resistance of the daisy chain DC can be measured at a specified temperature to evaluate the combined electrical reliability of the thirty one holes in the daisy chain DC.

Table 2 below identifies the measurement scheme for the test coupon 100' shown in FIGS. 6-8. Specifically, Table 2 lists the connection points C in the connector pattern 30 of test coupon 100' that connect to two of the four wires (e.g., electrodes) of the 4-wire kelvin bridge measurement system to side A trace patterns, and the connection points C in the connector pattern 30 that connect the other two wires (e.g., electrodes) of the 4-wire kelvin bridge measurement system to side B trace patterns, in order to test (e.g., measure the resistance of) each net consisting of a plated holes/vias, daisy chain DC, temperature net and the calibration/drift net.

TABLE 2

Measurement Scheme for PCB Test Coupon 100'

| Test Net | Kelvin Bridge Connector Pattern to Trace Side A | Kelvin Bridge Connector Pattern to Trace Side B |
|---|---|---|
| Plated Hole/Via H1 | C1 & C2 | C3 & C4 |
| Plated Hole/Via H2 | C1 & C2 | C7 & C8 |
| Plated Hole/Via H3 | C1 & C2 | C15 & C16 |
| Plated Hole/Via H4 | C1 & C2 | C19 & C20 |
| Plated Hole/Via H5 | C5 & C6 | C3 & C4 |
| Plated Hole/Via H6 | C5 & C6 | C7 & C8 |
| Plated Hole/Via H7 | C5 & C6 | C15 & C16 |
| Plated Hole/Via H8 | C5 & C6 | C19 & C20 |
| Plated Hole/Via H9 | C13 & C14 | C3 & C4 |
| Plated Hole/Via H10 | C13 & C14 | C7 & C8 |
| Plated Hole/Via H11 | C13 & C14 | C15 & C16 |
| Plated Hole/Via H12 | C13 & C14 | C19 & C20 |
| Plated Hole/Via H13 | C17 & C18 | C3 & C4 |
| Plated Hole/Via H14 | C17 & C18 | C7 & C8 |
| Plated Hole/Via H15 | C17 & C18 | C15 & C16 |
| Daisy Chain (DC) | C17 & C18 | C19 & C20 |
| Temperature | C9 & C10 | C11 & C12 |
| Calibration/Drift | C9 & C10 | C7 & C8 |

Therefore, the daisy chain DC of plated holes/vias in the test coupon 100' provides a test net that replaces the test net associated with pad P16 on substrate S, as shown in Table 1 above. Though the test coupon 100' replaces a single plated hole/via test net (e.g., of hole/via H16) with a daisy chain DC test net of thirty one plated holes/vias, one of skill in the art will recognize that the substrate S of test coupon 100' can include additional daisy chain test nets of varying quantity and size of plated holes/vias, each of which can replace other single plated hole/via test nets in the trace pattern on the substrate S of test coupon 100'. Therefore, the test coupon 100' can include any combination of daisy chain and single plated hole/via test nets.

Figure 9:
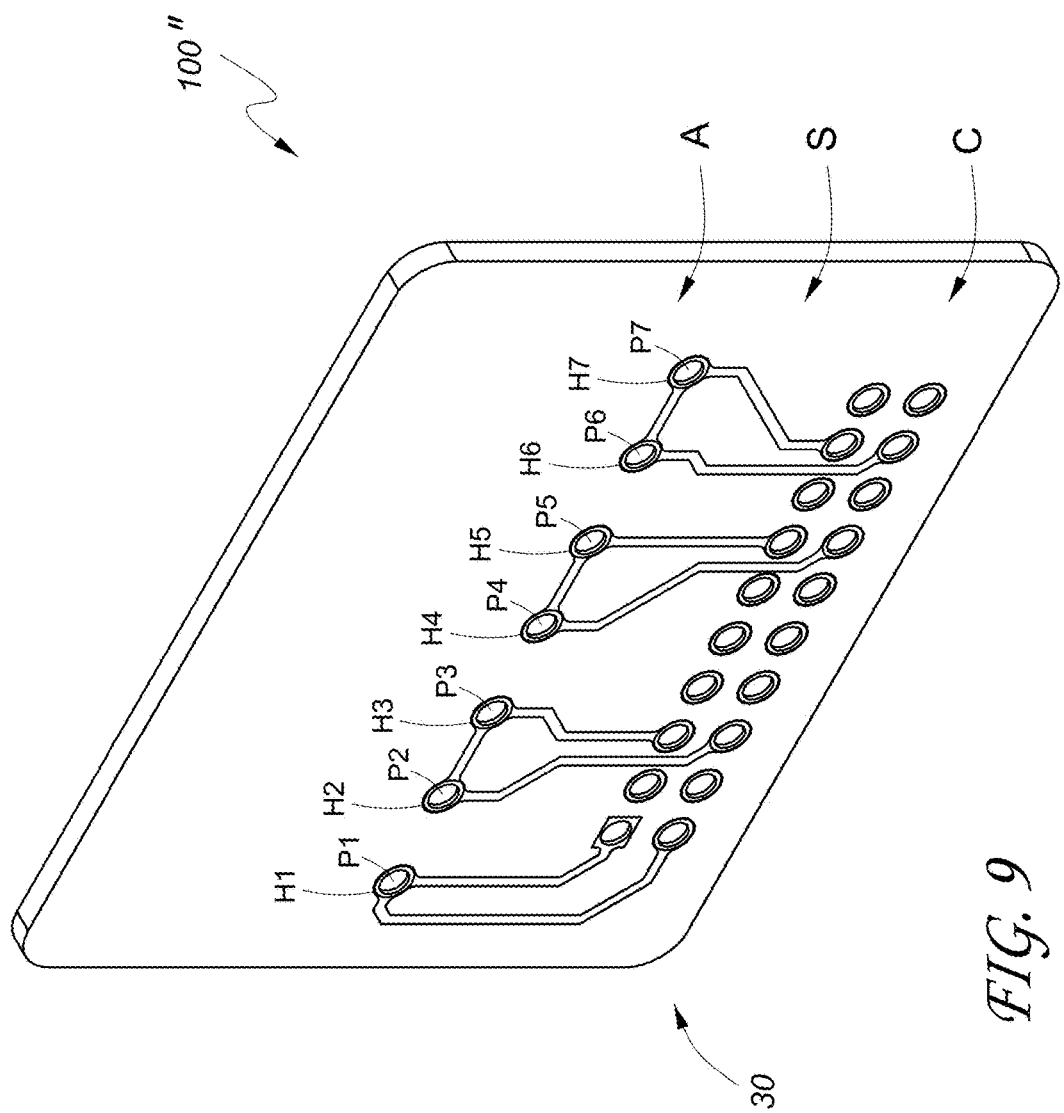
FIG. 9 is perspective schematic view of a first side A of a test coupon 100" or the internal substrate layers of a multilayer PCB test coupon.
Figure 9A:
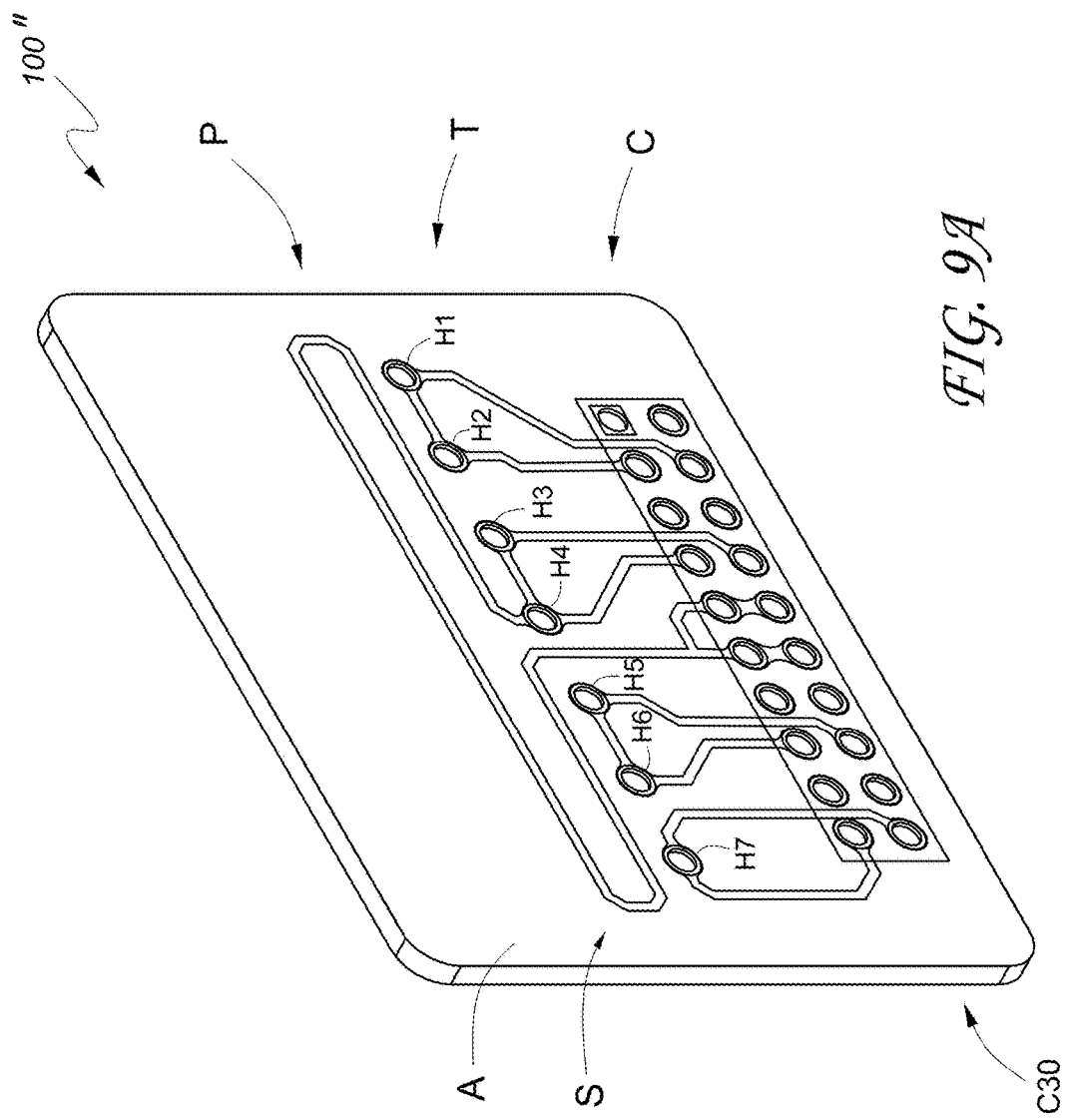
FIG. 9A is a perspective schematic view of a second side B of the test coupon 100" or the internal substrate layers of a multilayer PCB test coupon in FIG. 9.
Figure 10:
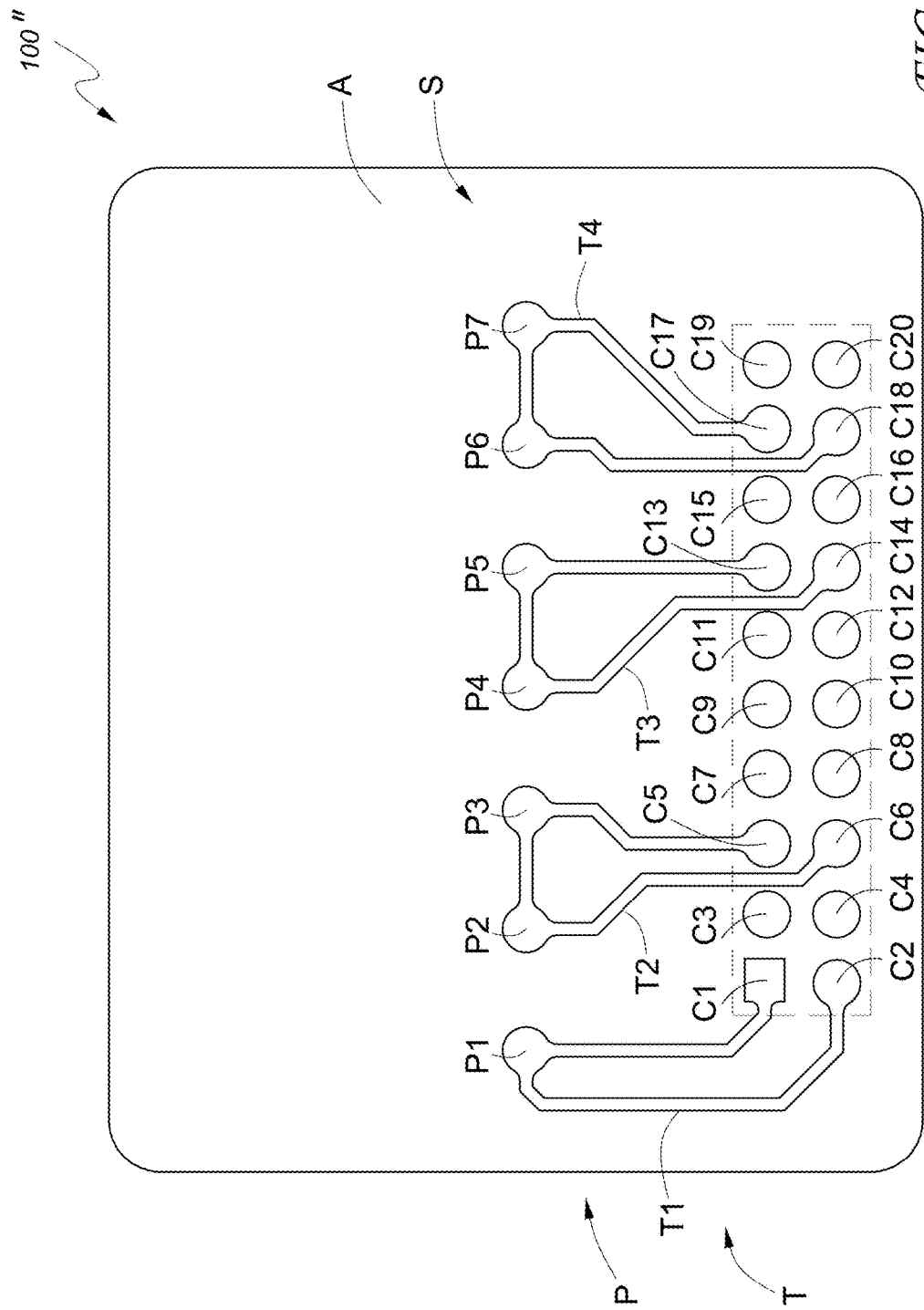
FIG. 10 is a schematic view of trace patterns T1-T4 on the first side of the laminated PCB test coupon substrate S (e.g. external or internal layer of a multilayer PCB test coupon). The integrated circular pads P (1-7) of these trace patterns T are attached to and terminate side A of the plated holes/vias H (1-7). The ends of each trace pattern T1-T4 terminate in 2 pads C of connector pattern 30 which is comprised of pads C1-C20. Each of the pads C in connector pattern 30 has a plated through hole associated with it that facilitates connection of the 4-wire kelvin bridge measurement system to the test coupon 100".
Figure 11:
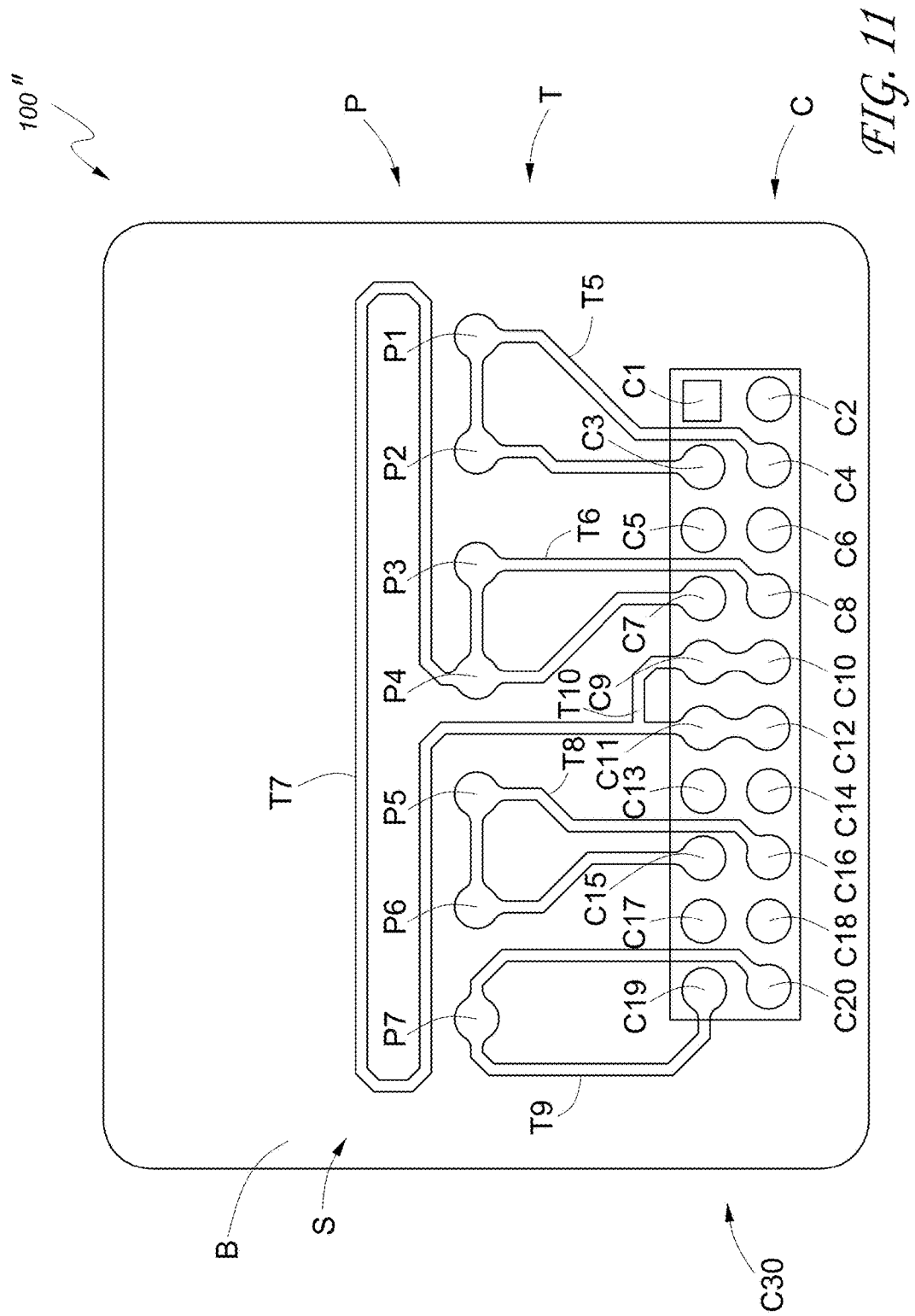
FIG. 11 is a schematic view of trace patterns T5-T10 on the second side of the laminated PCB test coupon substrate S (e.g. external or internal layer of a multilayer PCB test coupon). The integrated circular pads P (1-7) of these trace patterns are attached to and terminate side B of the plated holes/vias H (1-7). The ends of each trace pattern T5, T6, T8, T9 terminate in 2 pads C of connector pattern 30 which is comprised of pads C1-C20. The ends of each trace pattern T7, T10 terminate in 4 pads C of connector pattern 30 which is comprised of pads C1-C20. Each of the pads C in connector pattern 30 has a plated through hole associated with it that facilitates connection of the 4-wire kelvin bridge measurement system to the test coupon 100".

FIGS. 9-11 schematically illustrate a test coupon 100". Some of the features of the test coupon 100" are similar to features of the test coupon 100 in FIGS. 1-5. Thus, references numerals used to designate the various components of the test coupon 100" are identical to those used for identifying the corresponding components of the test coupon 100 in FIGS. 1-5, except that a " " "has been added to the numerical identifier. Therefore, the structure and description for the various features of the test coupon 100 in FIGS. 1-5 are understood to also apply to the corresponding features of the test coupon 100" in FIGS. 9-11, except as described below. FIG. 9 shows a perspective view of side A of the test coupon 100" and FIG. 9A shows a perspective view of side B of the test coupon 100" (e.g., where side B is the opposite side of the test coupon 100" from side A).

With continued reference to FIGS. 9-11, the test coupon 100" has an array of seven plated holes/vias H (1-7) that extend either through the entire test coupon 100" or between internal layers of a multilayer test coupon from side A (a first side) to an opposite side B (a second side) of the test coupon or internal layers of a multilayer test coupon 100". The test coupon 100" has a plurality of trace patterns T arranged to attach to multiple plated holes/vias H through pads P in trace patterns T from each side of the plated hole/via. The test coupon 100" has a connector pattern 30 with multiple plated through hole connection points C for electrical contacts, for example twenty connection points (e.g., C1, C2, C3, C4, C5, C6, C7, C8, C9, C10, C11, C12, C13, C14, C15, C16, C17, C18, C19, C20) to which the ends of the trace patterns T connect.

The trace patterns T viewed from side A of the substrate S differs from the trace patterns T viewed from the opposite side B of substrate S. Pads P has a plated hole/via H connecting to one of the trace patterns on side A and one of the trace patterns on side B of substrate S.

As shown in FIG. 10, on side A of the test coupon 100", a trace pattern T1 and its associated pad P (1) connect to one side of the associated plated hole/via H (1) and terminates into connection points C1 and C2, trace pattern T2 and its pads P (2-3) connect to one side of the associated plated holes/vias H (2-3) and terminates into connection points C5 and C6, trace pattern T3 and its pads P (4-5) connect to one side of the associated plated holes/vias H (4-5) and terminates into connection points C13 and C14, and trace pattern T4 and its pads P (6-7) connects to one side of the associated plated holes/vias H (6-7) and terminates into connection points C17 and C18. Trace pattern T1-T4 and their pads P (1-7) optionally connect one side of the plated holes/vias H (1-7) on side A via a substantially horizontal path (e.g., paths that extend generally parallel to an upper edge and/or a lower edge of the test coupon 100").

With reference to FIG. 11, on side B of the substrate S, a trace pattern T5 and its pads P (1-2) connect to one side of the associated plated holes/vias H (1-2) and terminates into connection points C3 and C4, trace pattern T6 and its pads P (3-4) connect to one side of the associated plated holes/vias H (3-4) and terminates into connection points C7 and C8, trace pattern T8 and its pads P (5-6) connect to one side of the plated holes/vias H (5-6) and terminates into connection points C15 and C16, and trace pattern T9 and its pad P (7) connect to one side of the plated hole/via H (7) and terminates into connection points C19 and C20. Trace patterns T5, T6, T8, T9 and their pads P (1-7) connect one side of the associated plated holes/vias H (1-7) on side B via a different path than on side A.

Trace pattern T7 does not connect to any tested plated holes/vias and terminates into connection points C7, C8, C11 and C12 and can be used for calculating the temperature of the side B surface of the substrate S. Copper conductors have a predictable resistance change with temperature, so trace T7 allows the generation of a resistance to temperature correlation profile for surface B of substrate S by measuring the resistance of that circuit (e.g., trace T7), at different temperatures during calibration or exposure of the test coupon 100" to thermal cycles to calculate the side B surface temperature of the substrate S associated with that circuit.

Trace pattern T10 extends from trace pattern T7. The resistance of trace pattern T10 can be measured by connecting the two wires (electrodes) of the kelvin bridge measurement system to connection points C9 and C10 of the test coupon 100" and connecting the other two wires (electrodes) of the kelvin bridge measurement system to connection points C11 and C12 of the test coupon 100". The measurement of the trace pattern T10 generally should always be the same at any specified temperature and can provide a reference resistance (e.g., for calibration) in a range similar to the resistance range of the plated hole/via to evaluate the consistency and drift of the resistance measurements made of the plated holes/vias using the kelvin bridge measurement system (e.g., drift of components in the meter/switching/interconnection systems). Such a reference resistance can be used to monitor and compensate for electrical drift in the kelvin bridge measurement system during electrical testing of the nets in test coupon 100" during thermal exposure. During thermal exposure of the test coupon 100", as the holes or vias H in pads P may fracture or crack causing the measured resistance of the test net to increase at a specified temperature. Though the reference resistance of the trace pattern T10 should remain the same at a specified temperature, one or more of the components of the kelvin bridge measurement system may be sensitive to temperature or other environmental changes, which may result in drift in the repeated resistance measurement of the trace pattern T10 at a specified temperature. Advantageously, the measurement system can compensate for drift by using changes in the resistance measurement of the trace pattern T10 at a specified temperature (e.g., as it applies to the resistance measurements of one of the plated holes/vias).

Optionally, one or more of the plated holes/vias H (1-7) placed in pads P (1-7) on the associated trace patterns can vary in one or more characteristics, such as via diameter, pad diameter, trace pattern width, grid size and connect sequence that mimics the PCB structure evaluated using test coupon 100". In other embodiments, the plated holes/vias H (1-7) can vary by via type (e.g., through, blind, buried, stacked) and be internal or external to the substrate S.

The test coupon 100" provides a matrix for testing made up of 20 individual connection points C1-C20 in the connector pattern 30 and allows for the individual resistance measurement of each of the plated holes/vias H (1-7) associated with pads P (1-7). In order to make a resistance measurement of one of the plated holes/vias H, 2-wires of the 4-wire kelvin bridge measurement system are attached to the endpoints associated with the trace pattern of side A connected to the hole H under test and the other 2-wires of the 4-wire kelvin bridge measurement system are attached to the endpoints associated with the trace pattern of side B connected to the hole H under test of the test net. For example, to measure the resistance of plated hole/via H1 associated with pad P1, two electrodes of the kelvin bridge measurement system are connected to connection points C1 and C2 of the test coupon 100" to form one side of the kelvin bridge test circuit (e.g., via trace pattern T1 on side A), and the other two electrodes of the kelvin bridge measurement system are connected to connection points C3 and C4 of the test coupon 100" to form the second side of the kelvin bridge test circuit (e.g., via trace pattern T5 on side B). The connections of the electrodes of the kelvin bridge measurement system to these connection points C1, C2, C3 and C4 isolate the plated hole/via H1 associated with pad P1 from the rest of the plated holes/vias so that only the resistance of plated hole/via H1 is measured. Since the plated hole/via H1 associated with pad P1 is the common hole between the pads of the two measurement patterns (e.g., defined in part by trace patterns T1 and T5) on either side of the plated hole/via H1, the resistance of plated hole/via H1 is what is measured when the electrodes of the kelvin bridge measurement system are connected to connection points C1, C2 and the other two electrodes of the kelvin bridge measurement system are connected to connection points C3, C4 of the test coupon 100". Advantageously, each plated hole/via net connects to two connection points C on the connector pattern 30 via a single trace pattern T on side A, and connects to two different connection points C on the connector pattern 30 via a single trace pattern T on side B of the test coupon 100, as further described in below.

Table 3 below identifies the measurement scheme for the test coupon 100" shown in FIGS. 9-11. Specifically, Table 3 lists the connection points C in the connector pattern 30 of the test coupon 100 that connects two of the four wires (e.g., electrodes) of the 4-wire kelvin bridge measurement system to the side A trace patterns, and the connection points C in the connector pattern 30 that connects the other two wires (e.g., electrodes) of the 4-wire kelvin bridge measurement system to side B trace patterns, in order to test (e.g., measure the resistance of) each net consisting of a plated hole/via H, temperature net and the calibration/drift net.

TABLE 3

Measurement Scheme for PCB Test Coupon 100"

| Test Net | Kelvin Bridge Connection Points to Trace Pattern Side A | Kelvin Bridge Connection Points to Trace Pattern Side B |
|---|---|---|
| Plated Hole/Via H1 | C1 & C2 | C3 & C4 |
| Plated Hole/Via H2 | C5 & C6 | C3 & C4 |
| Plated Hole/Via H3 | C5 & C6 | C7 & C8 |
| Plated Hole/Via H4 | C13 & C14 | C7 & C8 |
| Plated Hole/Via H5 | C13 & C14 | C15 & C16 |
| Plated Hole/Via H6 | C17 & C18 | C15 & C16 |
| Plated Hole/Via H7 | C17 & C18 | C19 & C20 |
| Temperature | C7 & C8 | C11 & C12 |
| Calibration/Drift | C9 & C10 | C11 & C12 |

In the test coupon 100" of FIGS. 9-11, each of the seven plated holes/vias connects to a separate test net. Two additional test nets are provided to measure surface temperature and calibration/drift (via trace patterns T7 and T10), as discussed above. Advantageously, the routing of the trace patterns T on the substrate S (e.g., trace patterns T1-T4 on side A and trace patterns T5, T6, T8, T9 on side B) allow each of the seven plated holes/vias and the two reference conductors (for surface temperature and calibration/drift) to be measured via only 20 connections points (i.e., C1-C20). Therefore, the test coupon 100 increases the amount of electrical test net data available from thermal exposure of test coupon 100", using a matrix of 9 nets that can be measured with only 20 connections that would normally test four daisy chain test nets if a matrix is not used.

In use, the connector pattern 30 of test coupon 100 is attached to a connection system of a thermal exposure and electrical testing machine. The connection system in the machine interfaces with the connector pattern 30 of the test coupon 100. The machine can have an matrix switch to facilitate the connection of four test pattern inputs associated with each test net matrixing connection points C from test coupon 100 to the four inputs of the kelvin bridge measurement system (e.g., connect two wires of the 4-wire kelvin bridge measurement system to two connection points C of test coupon 100 connected to a trace pattern on side A of the substrate S and connect two wires of the 4-wire kelvin bridge measurement system to two connection points C of test coupon 100 connected to a trace pattern on side B of the substrate S). Therefore, operation of the array switch will connect the four inputs of the 4-wire kelvin bridge measurement system to four connection points C (two connected with a trace pattern on side A and two connected to a trace pattern on side B of substrate S) to measure the resistance of one net containing a plated hole/via (e.g., one of the seven plated holes/vias). The test coupon 100" is subjected to thermal exposure in the machine to test the electrical reliability of the test coupon 100" (e.g., of each of the holes/vias). During thermal exposure and electrical testing, stresses on the holes or vias due to the thermal exposure, can cause one or more plated holes/vias to fracture or crack and resistance measurements to increase at a specified temperature. Therefore, by measuring resistance of each of the plated holes/vias at a specified temperature during thermal exposure allows for collection of data on the reliability of each of the plated holes/vias.

Figure 12:
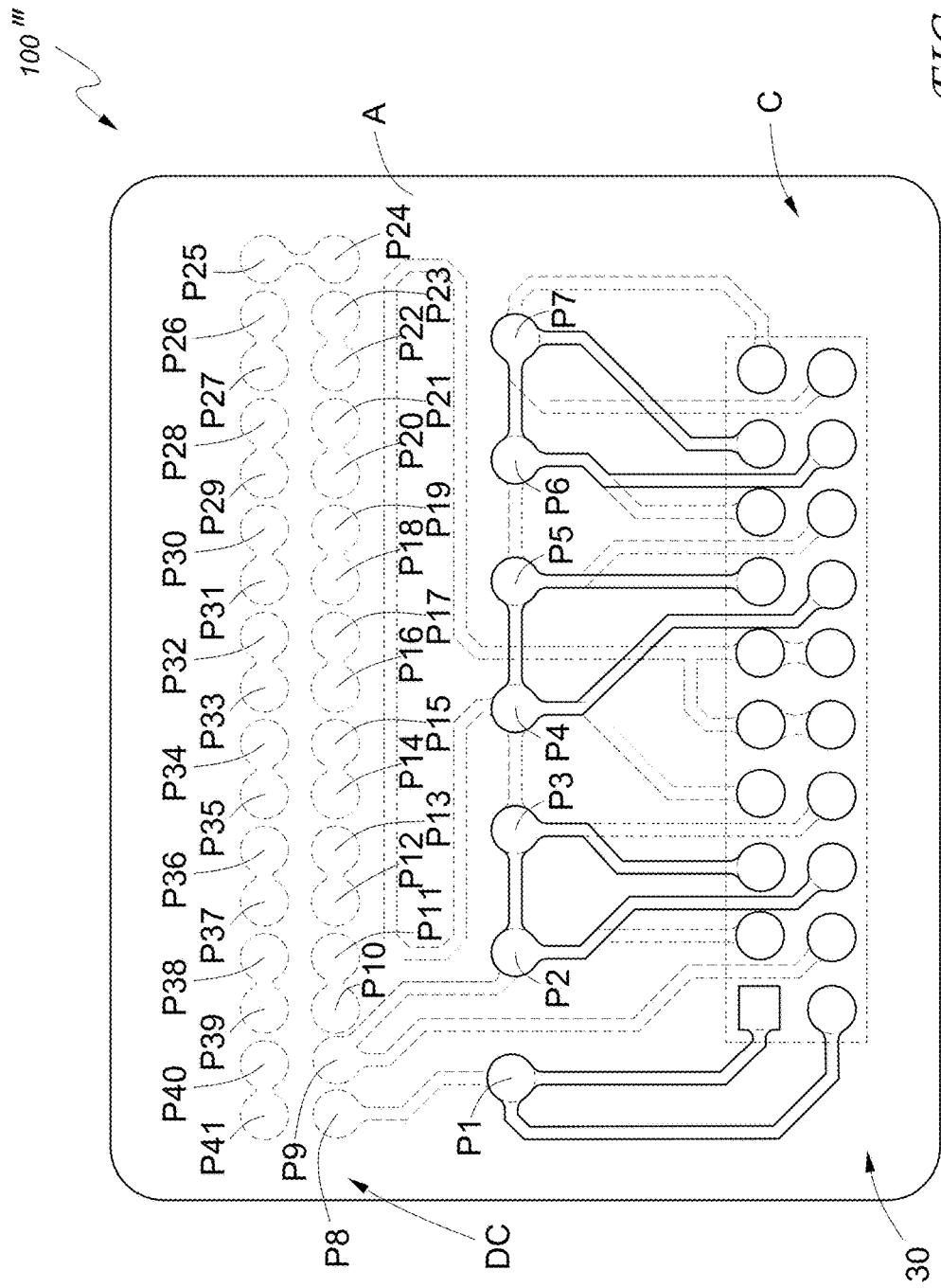
FIG. 12 is a schematic view of a test coupon 100''' with trace patterns on both sides of a laminated PCB test coupon substrate S (e.g. external or internal layers of a multilayer PCB test coupon) superimposed on each other, with the trace patterns on the second side of the laminated PCB test coupon substrate S (e.g. external or internal layer of a multilayer PCB test coupon) shown in phantom.
Figure 13:
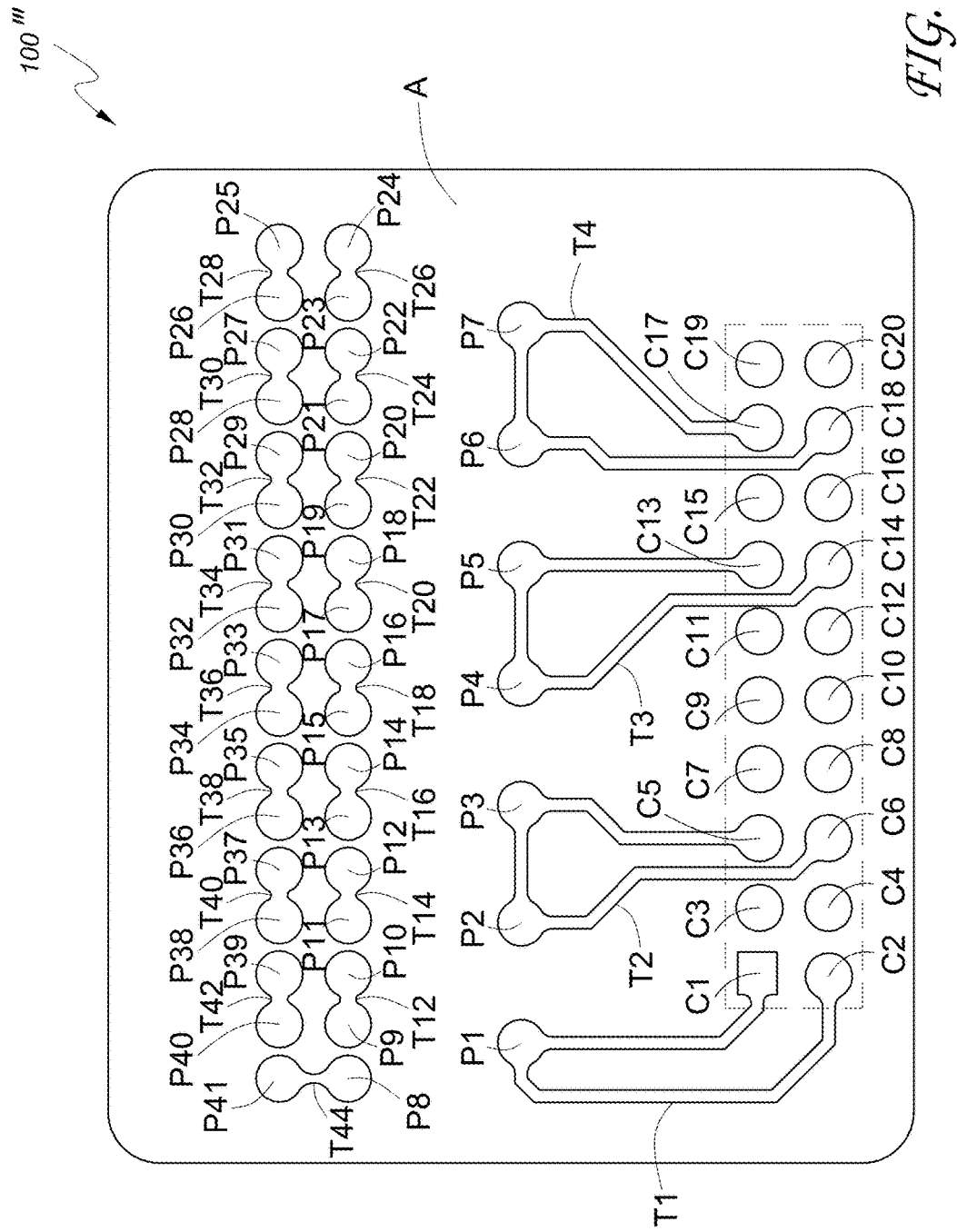
FIG. 13 is a schematic view of trace patterns T1-T4 and TDCA on a first side A of the laminated PCB test coupon substrate S (external or internal layer of a multilayer PCB test coupon) of a test coupon 100". The integrated circular pads P (1-41) of these trace patterns T are attached to and terminate side A of the associated plated holes/vias. The ends of trace patterns T1-T4 terminate in 2 pads C of connector pattern 30 which is comprised of pads C1-C20. Each of the pads C in connector pattern 30 has a plated through hole associated with it that facilitates connection to the 4-wire kelvin bridge measurement system. The pads P (8-41) associated with TDCA trace pattern are attached to and terminate side A of the associated plated holes/vias. The trace pattern TDCA connects plated hole/via pairs together on side A (e.g. 23 & 24) which are then consecutively joined together to adjacent connected pairs (e.g. 25 & 26) with trace pattern TDCB on side B to form a daisy chain test net.
Figure 14:
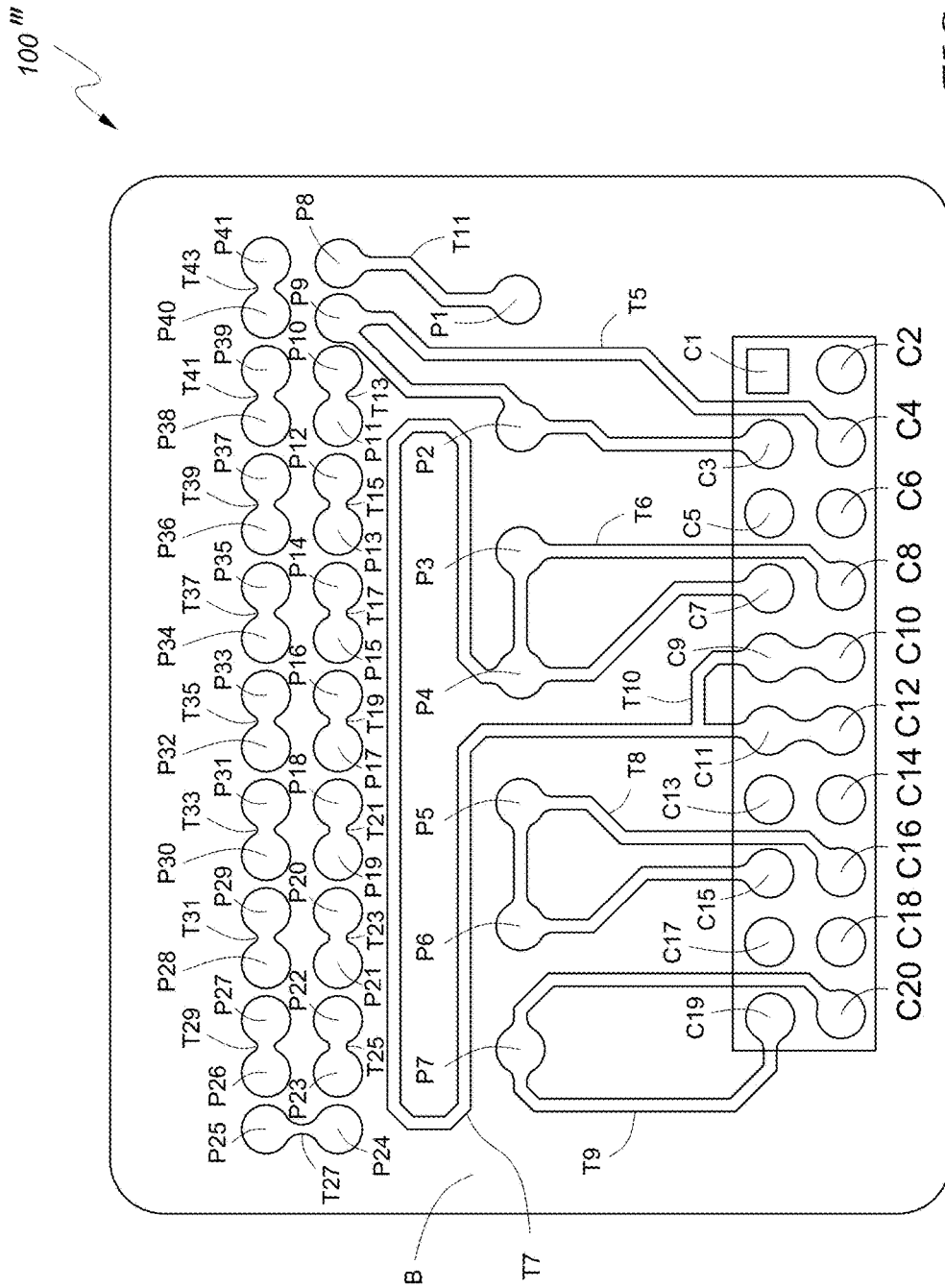
FIG. 14 is a schematic view of trace patterns T5-T10 and TDCB on a second side B of the laminated PCB test coupon substrate S (e.g. external or internal layer of a multilayer PCB test coupon) that is opposite the first side A of the test coupon 100'''. The integrated circular pads P (1-41) of these trace patterns T are attached to and terminate side B of the associated plated holes/vias. The ends of trace patterns T5, T6, T8, T9 terminate in 2 pads C of connector pattern 30 which is comprised of pads C1-C20. The ends of trace patterns T7, T10 terminate in 4 pads C of connector pattern 30 which is comprised of pads C1-C20. Each of the pads C in connector pattern 30 has a plated through hole associated with it that facilitates connection of the 4-wire kelvin bridge measurement system to the test coupon. The pads P (8-41) associated with TDCB trace pattern are attached to and terminate side B of the associated plated holes/vias. The trace pattern TDCB connects plated hole/via pairs together on side B (e.g., 24 & 25) which are then consecutively joined together to adjacent connected pairs (e.g., 26 & 27) with trace pattern TDCA on side A to form a daisy chain net.

FIGS. 12-14 schematically illustrates a test coupon 100'''. Some of the features of the test coupon 100''' are similar to features of the test coupon 100" in FIGS. 9-11. Thus, references numerals used to designate the various components of the test coupon 100''' are identical to those used for identifying the corresponding components of the test coupon 100" in FIGS. 9-11, except that a "'" has been added to the numerical identifier. Therefore, the structure and description for the various features of the test coupon 100" in FIGS. 9-11 are understood to also apply to the corresponding features of the test coupon 100''' in FIGS. 12-14, except as described below.

The test coupon 100''' differs from the test coupon 100" in the shape of the trace pattern T5', and in that the test coupon 100''' includes a daisy chain DC of plated holes/vias interconnected by trace pattern TDCA and TDCB. Trace pattern TDCA is defined by trace segments T12, T14, T16, T18, T20, T22, T24, T26, T28, T30, T32, T34, T36, T38, T40, T42 and T44, each trace segment connecting two plated holes on side A. Trace pattern TDCB is defined by trace segments T11, T13, T15, T17, T19, T21, T23, T25, T27, T29, T31, T33, T35, T37, T39, T41 and T43, each trace segment connecting two plated holes on side B. The trace segments of trace pattern TDCA on side A alternate with trace segments of trace pattern TDCB on side B of test coupon 100''', creating a daisy chain of interconnected plated holes/vias. The end points of the daisy chain DC (pads P8 and P9) terminate into connection points C1, C2, C3 and C4 via trace patterns T1 and T5. During thermal exposure, the electrical resistance of the daisy chain DC can be measured at a specified temperature to evaluate the combined electrical reliability of the thirty-four holes in the daisy chain DC.

Table 4 below identifies the measurement scheme for the test coupon 100''' shown in FIGS. 12-14. Specifically, Table 4 lists the connection points C in the connector pattern 30 of test coupon 100''' that connect to two of the four wires (e.g., electrodes) of the 4-wire kelvin bridge measurement system to side A trace patterns, and the connection points C in the connector pattern 30 that connect the other two wires (e.g., electrodes) of the 4-wire kelvin bridge measurement system to side B trace patterns, in order to test (e.g., measure the resistance of) each net consisting of a plated holes/vias, daisy chain DC, temperature net and the calibration/drift net.

TABLE 4

Measurement Scheme for PCB Test Coupon 100'''

| Test Net | Kelvin Bridge Connector Pattern to Trace Side A | Kelvin Bridge Connector Pattern to Trace Side B |
|---|---|---|
| Plated Hole/Via H2 | C5 & C6 | C3 & C4 |
| Plated Hole/Via H3 | C5 & C6 | C7 & C8 |

TABLE 4-continued

Measurement Scheme for PCB Test Coupon 100'''

| Test Net | Kelvin Bridge Connector Pattern to Trace Side A | Kelvin Bridge Connector Pattern to Trace Side B |
|---|---|---|
| Plated Hole/Via H4 | C13 & C14 | C7 & C8 |
| Plated Hole/Via H5 | C13 & C14 | C15 & C16 |
| Plated Hole/Via H6 | C17 & C18 | C15 & C16 |
| Plated Hole/Via H7 | C17 & C18 | C19 & C20 |
| Daisy Chain (DC) | C1 & C2 | C3 & C4 |
| Temperature | C7 & C8 | C11 & C12 |
| Calibration/Drift | C9 & C10 | C11 & C12 |

Therefore, the daisy chain DC of plated holes/vias in the test coupon 100''' provides a test net that replaces the test net associated with pad P1 on substrate S, as shown in Table 4 above. Though the test coupon 100''' replaces a single plated hole/via test net (e.g., of hole/via H1) with a daisy chain DC test net of thirty-four plated holes/vias, one of skill in the art will recognize that the substrate S of test coupon 100' can include additional daisy chain test nets of varying quantity and size of plated holes/vias, each of which can replace other single plated hole/via test nets in the trace pattern on the substrate S of test coupon 100'''. Therefore, the test coupon 100''' can include any combination of daisy chain and single plated hole/via test nets.

Methods of Testing

FIGS. 15-18 schematically show different methods of testing the test coupon(s) 100, 100', 100'', 100'''.

Figure 15:
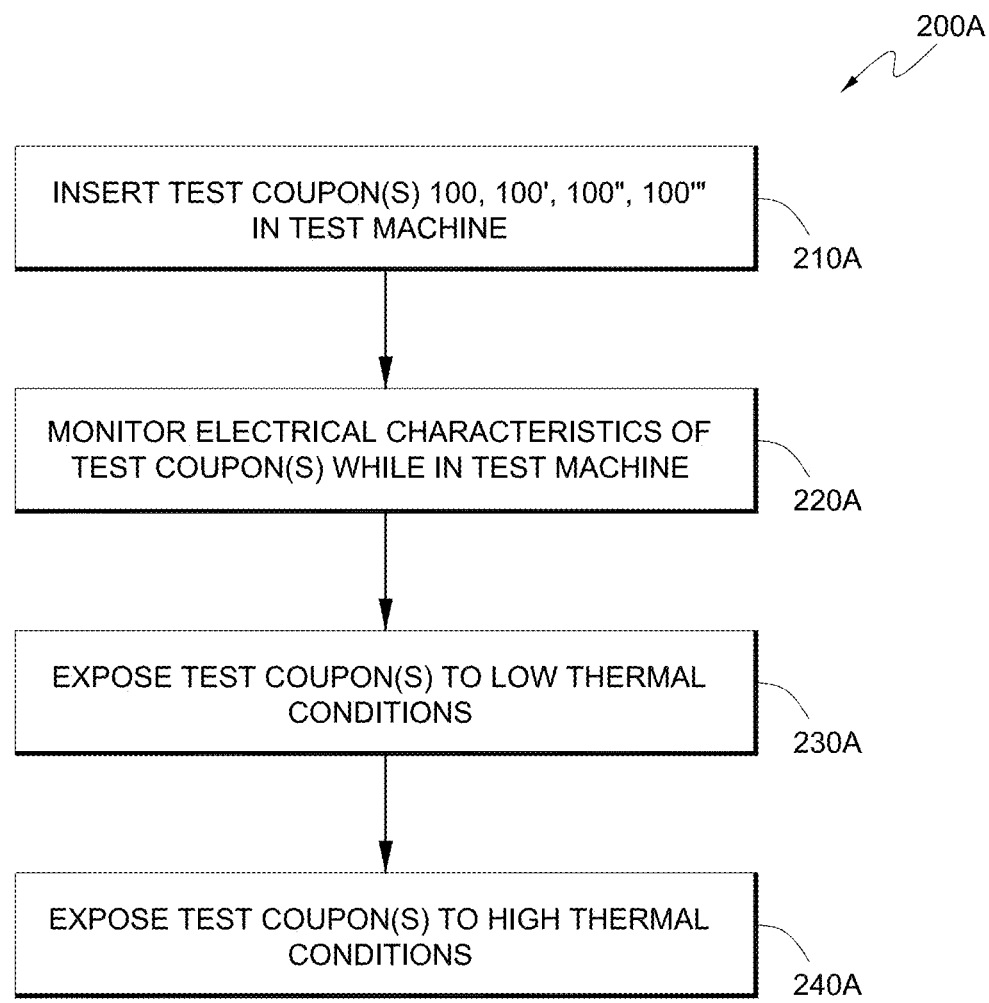
FIG. 15 is a block diagram of one method for testing test coupon(s).

FIG. 15 shows a method 200A for testing the test coupon(s) 100, 100', 100'', 100'''. The method includes the steps of inserting 210A one or more test coupon(s) 100, 100', 100'', 100''' into a test machine (e.g., into a chamber of the test machine), monitoring 220A electrical characteristics of the test coupon(s) 100, 100', 100'', 100''' while in the test machine (e.g., using a 4-wire kelvin bridge measurement system, as discussed above), exposing 230A the test coupon(s) 100, 100', 100'', 100''' to a low thermal condition (e.g., to temperatures of between approximately 0 degrees C. and about −65 degrees C.), and exposing 240A the test coupon(s) 100, 100', 100'', 100''' to high thermal conditions (e.g., to temperatures of between approximately 85 degrees C. and about 260 degrees C.). The test coupon(s) 100, 100', 100'', 100''' can be cycled between the low thermal conditions and the high thermal conditions (e.g., for a predetermined number of cycles or for a predetermined period of time). In one implementation, the test coupon(s) 100, 100', 100'', 100''' would be physically moved between different chambers of the test machine, with one chamber having lower thermal conditions and another chamber having high thermal conditions. In one implementation, the thermal conditions can be provided in an air-to-air environment. In another implementation, the thermal conditions can be provided in a liquid-to-liquid environment.

Figure 16:
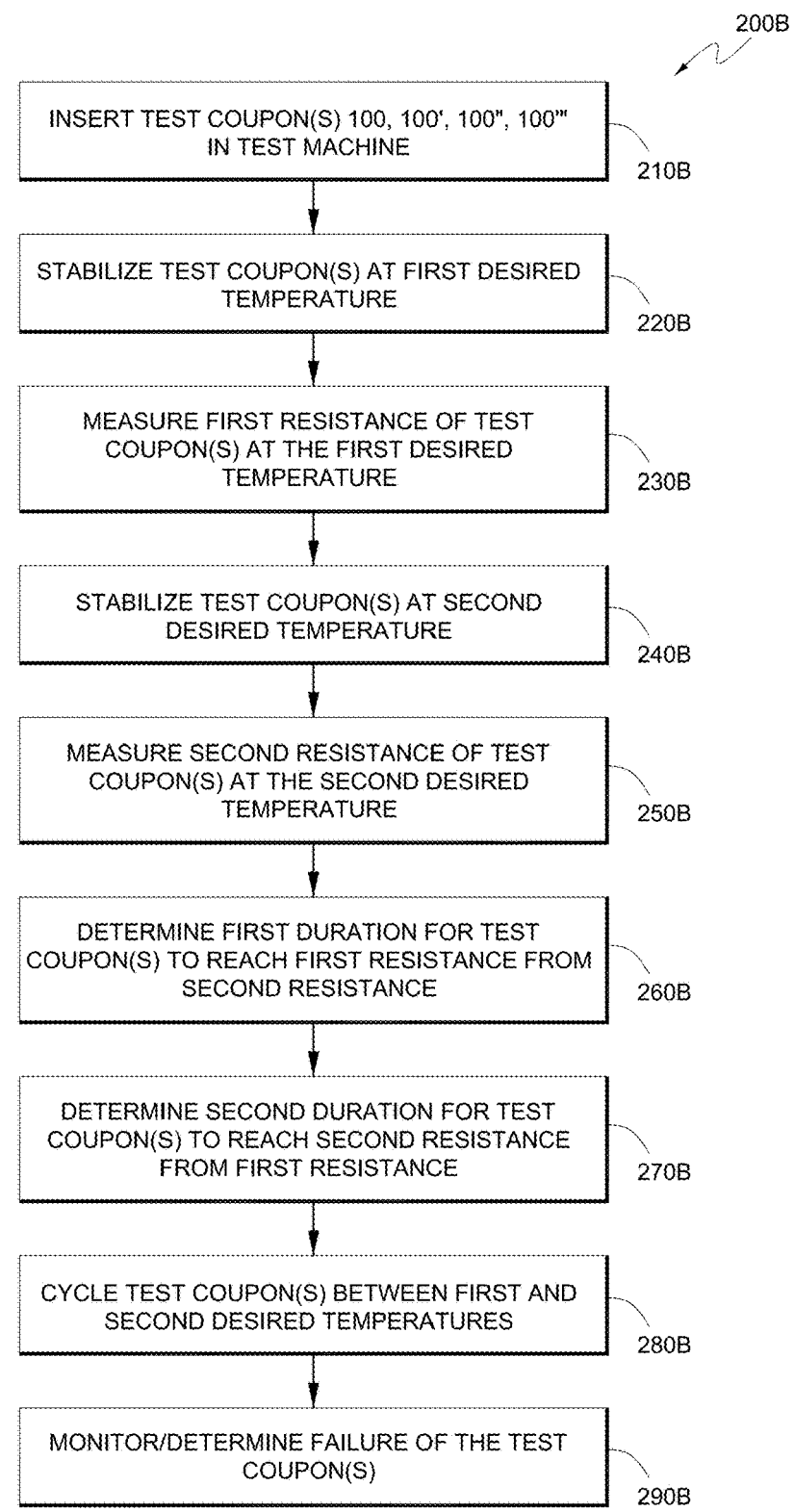
FIG. 16 is a block diagram of another method for testing test coupon(s).

FIG. 16 shows a method 200B for testing test coupon(s) 100, 100', 100'', 100'''. The method includes the steps of inserting 210B one or more test coupon(s) 100, 100', 100'', 100''' into a test machine (e.g., into a chamber of the test machine), stabilizing 220B the test coupon(s) 100, 100', 100'', 100''' at a first desired temperature, measuring 230B a first resistance of the test coupon(s) at the first desired temperature (e.g., with the 4-wire bridge measurement system described above), stabilizing 240B the test coupon(s) 100, 100', 100'', 100''' at a second desired temperature, measuring 250B a second resistance of the test coupon(s) at the first desired temperature (e.g., with the 4-wire bridge measurement system described above), determining 260B a first duration for the test coupon(s) 100, 100', 100'', 100''' to reach the first resistance from the second resistance, determining 270B a second duration for the test coupon(s) 100, 100', 100'', 100''' to reach the second resistance from the first resistance, cycling 280B the test coupon(s) 100, 100', 100'', 100''' between the first and second desired temperatures, and optionally monitoring or determining 290B a failure of the test coupon(s) 100, 100', 100'', 100''. In one implementation, the test coupon(s) 100, 100', 100'', 100'' remain in one chamber and exposed to a fluid that flows through the chamber, where the chamber can be conditioned to first desired temperature, second desired temperature, etc. In one implementation, the fluid is compressed dry air.

Figure 17:
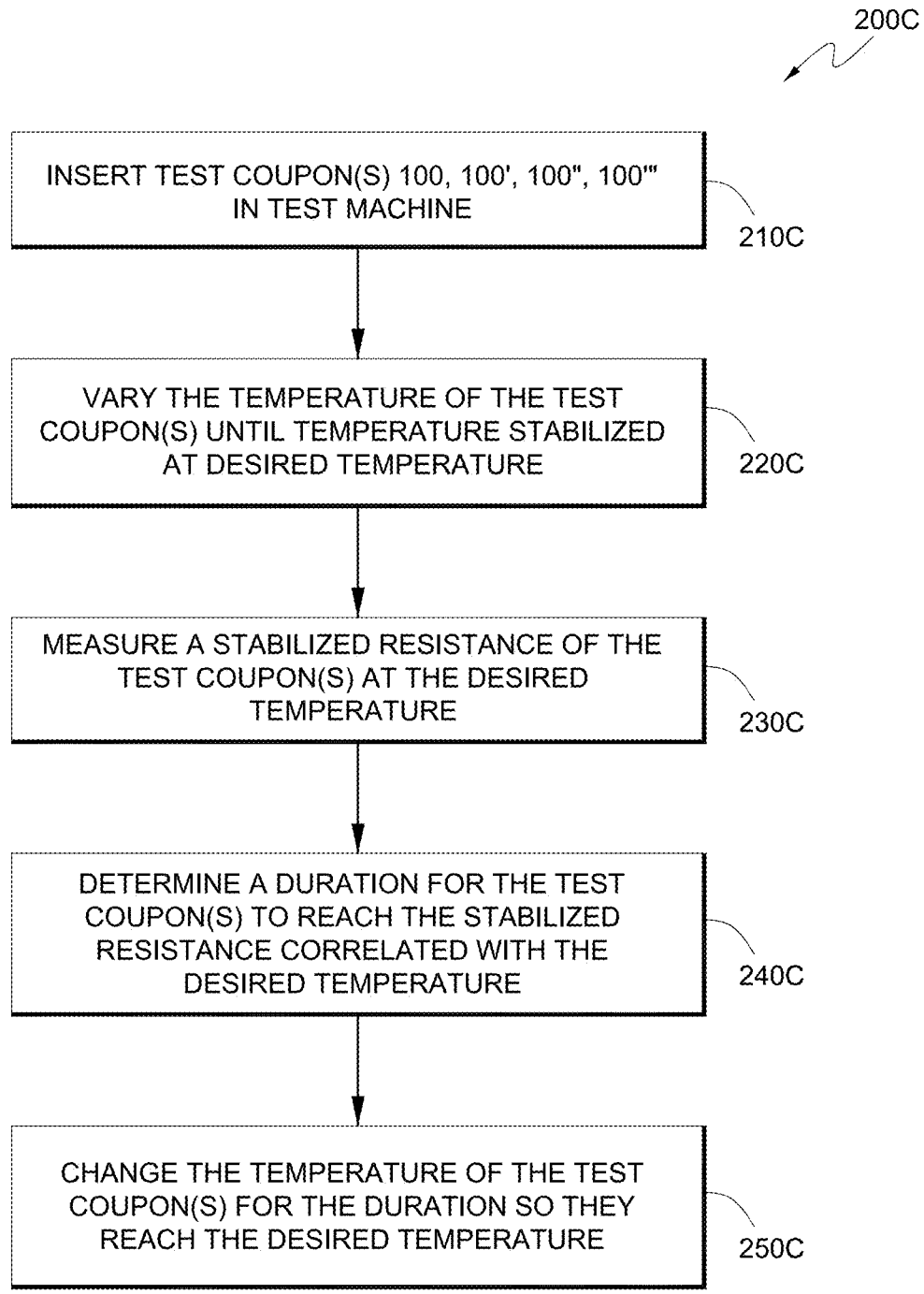
FIG. 17 is a block diagram of another method for testing test coupon(s).

FIG. 17 shows a method 200C for testing test coupon(s) 100, 100', 100'', 100'''. The method includes the steps of inserting 210C one or more test coupon(s) 100, 100', 100'', 100''' into a test machine (e.g., into a chamber of the test machine), varying 220C the temperature of the test coupon(s) 100, 100', 100'', 100''' until the temperature is stabilized at a desired temperature, measuring 230C a stabilized resistance of the test coupon(s) 100, 100', 100'', 100''' at the desired temperature, determining 240C a duration for the test coupon(s) 100, 100', 100'', 100''' to reach the stabilized resistance correlated with the desired temperature, and changing 250C the temperature of the test coupon(s) 100, 100', 100'', 100''' for the duration so they reach the desired temperature. In one implementation, the test coupon(s) 100, 100', 100'', 100'' remain in one chamber and exposed to a fluid that flows through the chamber, where the chamber can be conditioned to first desired temperature, second desired temperature, etc. In one implementation, the fluid is compressed dry air.

Figure 18:
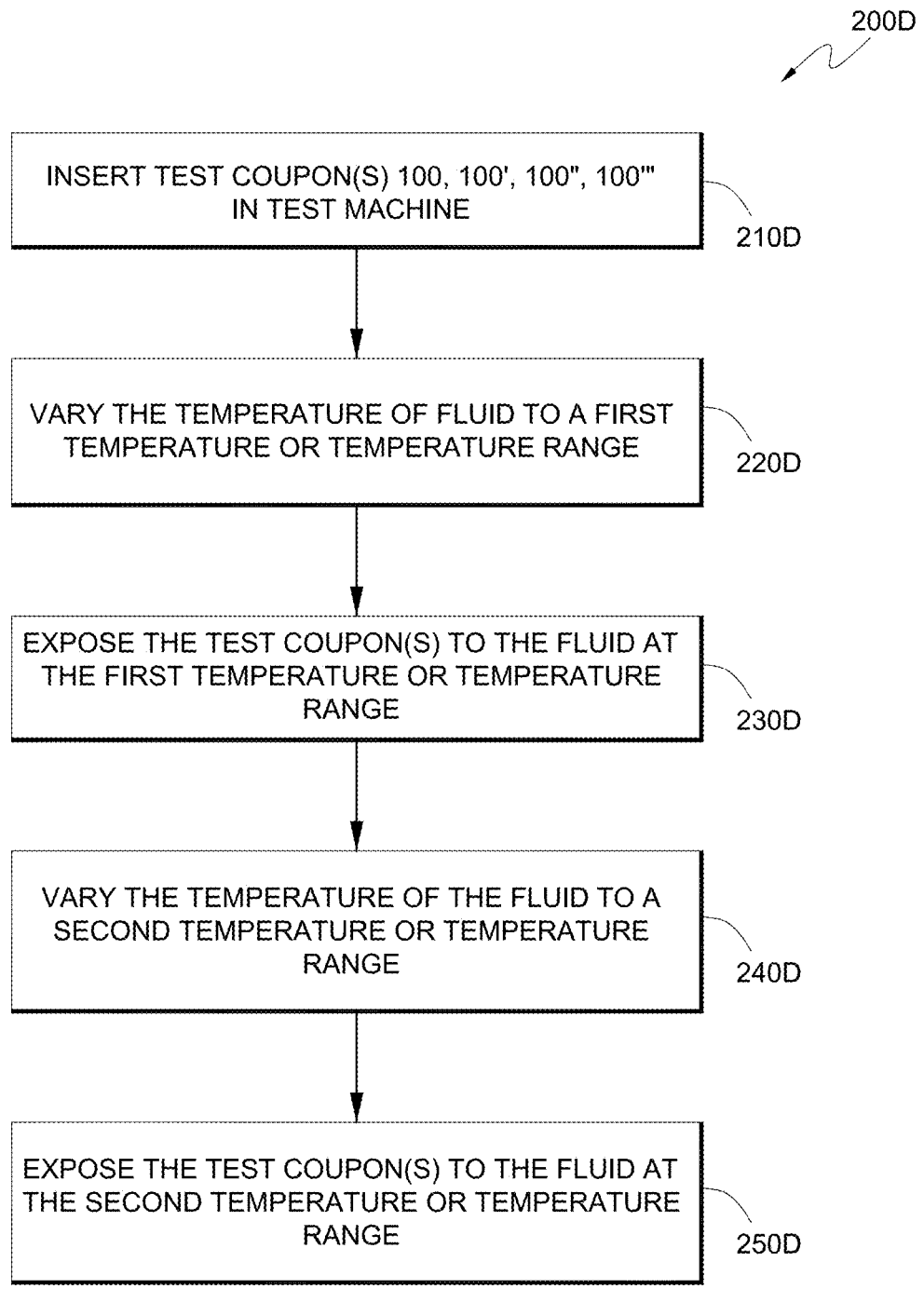
FIG. 18 is a block diagram of another method for testing test coupon(s).

FIG. 18 shows a method 200D for testing test coupon(s) 100, 100', 100'', 100''. The method includes the steps of inserting 210D one or more test coupon(s) 100, 100', 100'', 100''' into a test machine (e.g., into a chamber of the test machine), varying 220D the temperature of a fluid to a first temperature or temperature range, exposing 230D the test coupon(s) 100, 100', 100'', 100''' to the fluid at the first temperature or temperature range, varying 240D the temperature of the fluid to a second temperature or temperature range, and exposing 250D the test coupons 100, 100', 100'', 100''' to the fluid at the second temperature or temperature range. In one implementation, the test coupon(s) 100, 100', 100'', 100'' remain in one chamber and exposed to the fluid that flows through the chamber. In one implementation, the fluid is compressed dry air.

Additional Embodiments

In embodiments of the present invention, a printed circuit board test coupon for electrical testing during thermal exposure, and method of making the same, may be in accordance with any of the following clauses:

Clause 1. A printed circuit board test coupon for electrical testing during thermal exposure, comprising:
  a substrate having one or more conductive layers and extending between a first side and a second side opposite the first side;
  a plurality of plated holes/vias formed within the substrate of the test coupon or extending through the entire substrate of the test coupon from a first surface on the first side A of the plated hole/via to a second surface on the second side B of the plated hole/via;

a first plurality of trace patterns defining a first pattern, each of the first plurality of trace patterns interconnecting a subset of the plurality of plated holes/vias on the first side of the plated holes/vias;

a second plurality of trace patterns defining a second pattern, each of the second plurality of trace patterns interconnecting a different subset of the plurality of holes/vias on the second side of the plated holes/vias, the second pattern being different than the first pattern; and a connector pattern defined within or on the surface of the substrate, the first and second plurality of trace patterns connected to a plurality of connection points in the connector pattern, wherein a measurement of resistance of each plated hole/via is provided by connecting 2 wires of a 4-wire kelvin bridge measurement system to the first side and connecting 2 wires of a 4-wire kelvin bridge measurement system to the second, side of the plated hole/via using connection points for one of the first plurality of trace patterns and one of the second plurality of trace patterns that connect to said plated hole/via.

Clause 2. The test coupon of clause 1, wherein the plurality of plated holes/vias consist of sixteen plated holes/vias formed within or completely through the substrate.

Clause 3. The test coupon of any preceding clause, wherein the first plurality of trace patterns comprises four trace patterns, each connecting to the first side of four plated holes/vias.

Clause 4. The test coupon of clause 3, wherein each of the four trace patterns connects to the first side of four plated holes/vias along a row that extends generally parallel with an edge of the substrate, the four trace patterns defining a horizontal row trace pattern.

Clause 5. The test coupon of any preceding clause, wherein the second plurality of trace patterns comprises four trace patterns, each connecting to the second side of four plated holes/vias.

Clause 6. The test coupon of clause 5, wherein each of the four trace patterns connects to the second side of four plated holes/vias along a row that extends at a non-parallel angle relative to an edge of the substrate, the four trace patterns defining an angled row trace pattern.

Clause 7. The test coupon of any preceding clause, wherein one of the second plurality of trace patterns are configured to measure temperature and two of the second plurality of trace patterns are configured to measure calibration/drift by resistance measurements.

Clause 8. The test coupon of any preceding clause, further comprising a daisy chain of plated holes/vias in the substrate consecutively connected to connection points in the connector via one of the first plurality of trace patterns on the first side and one of the second plurality of trace patterns on the second side.

Clause 9. The test coupon of any preceding clause, wherein each of the plurality of plated holes/vias comprises one of a blind via, a buried via, a stacked via and a through hole.

Clause 10. A printed circuit board test coupon for electrical testing during thermal exposure, comprising:
a substrate having one or more conductive layers and extending between a first side and a second side opposite the first side;
a plurality of plated holes/vias comprising sixteen plated holes/vias formed within the substrate of the test coupon or extending through the entire substrate of the test coupon from a first surface on the first side of the plated hole/via to a second surface on the second side of the plated hole/via;

a first plurality of trace patterns defining a first pattern comprising four trace patterns on the first side, each of the four trace patterns interconnecting four of the plated holes/vias on the first side of the plated holes/vias;

a second plurality of trace patterns defining a second pattern comprising four trace patterns on the second side, each of the four trace patterns interconnecting plated holes/vias on the second side of the plated hole/via, the second pattern being different than the first pattern and each of the sixteen plated holes/vias connecting to one of the trace patterns on the first side and one of the trace patterns on the second side of the via; and a connector pattern defined in the substrate having twenty connection points, the first and second plurality of trace patterns connected to the twenty connection points in the connector pattern, wherein a measurement of resistance of each of the sixteen plated holes/vias is provided by connecting 2 wires each of a 4-wire kelvin bridge measurement system to the first and second sides of the plated hole/via using connection points in the connector pattern for one of the first plurality of trace patterns and one of the second plurality of trace patterns that connect to said plated hole/via.

Clause 11. The test coupon of clause 10, wherein each of the four trace patterns on the first side connects four plated holes/vias along a row that extends generally parallel with an edge of the substrate, the four trace patterns defining a horizontal row pattern.

Clause 12. The test coupon of clause 10 or 11, wherein each of the four trace patterns on the second side connects four plated holes/vias along a row that extends at a non-parallel angle relative to an edge of the substrate, the four trace patterns defining an angled row pattern.

Clause 13. The test coupon of any of clauses 10-12, wherein one of the second plurality of trace patterns are configured to measure temperature and two of the second plurality of trace patterns are configured to measure calibration/drift by resistance measurements.

Clause 14. The test coupon of any of clauses 10-13, wherein each of the plurality of plated holes/vias comprises one of a blind via, a buried via, a stacked via and a through hole.

Clause 15. A method of making a printed circuit board test coupon for electrical testing during thermal exposure, comprising:
forming a substrate having one or more conductive layers and extending between a first side and a second side opposite the first side;
forming a plurality of plated holes/vias within the substrate of the test coupon or such that they extend through the entire substrate of the test coupon from a first surface on the first side of the plated hole/via to a second surface on the second side of the plated hole/via;
forming a first plurality of trace patterns in a first pattern, each of the first plurality of trace patterns interconnecting a subset of the plurality of plated holes/vias on the first side of the substrate;
forming a second plurality of trace patterns in a second pattern different than the first pattern, each of the second plurality of trace patterns interconnecting a different subset of the plurality of vias on the second side of the plated hole/via; and providing a connector pattern in the substrate having a plurality of connection points, the first and second plurality of trace patterns connected to the plurality of connection points, wherein a resistance measurement of each plated hole/via is provided by connecting 2 wires of a 4-wire kelvin bridge measurement system to the first side and connecting 2 wires of a 4-wire kelvin bridge measurement system to the second side of the plated hole/via using connection points for one of the first plurality of trace patterns and one of the second plurality of trace patterns that connect to said plated hole/via.

Clause 16. The method of clause 15, wherein the plurality of plated holes/vias consist of sixteen plated holes/vias formed within the substrate of the coupon or extending through the entire substrate of the test coupon.

Clause 17. The method of clause 15 or 16, wherein the first plurality of trace patterns comprises four trace patterns, each connecting four plated holes/vias.

Clause 18. The method of any of clauses 15-17, wherein each of the four trace patterns connects four plated holes/vias along a row that extends generally parallel with an edge of the substrate, the first pattern defined by the four trace patterns being a horizontal row pattern.

Clause 19. The method of any of clauses 15-18, wherein the second plurality of trace patterns comprises four trace patterns, each connecting four plated holes/vias.

Clause 20. The method of any of clauses 15-19, wherein each of the four trace patterns connects four plated holes/vias along a row that extends at a non-parallel angle relative to an edge of the substrate, the second pattern defined by the four trace patterns being an angled row pattern.

Clause 21. The method of any of clauses 15-20, wherein one of the second plurality of trace patterns is configured to measure temperature and two of the second plurality of trace patterns are configured to measure calibration/drift by resistance measurement.

Clause 22. The method of any of clauses 15-21, further comprising forming a daisy chain of plated holes/vias in the substrate consecutively connected to connection points in the connector pattern by one of the first plurality of trace patterns and one of the second plurality of trace patterns.

Clause 23. The method of any of clauses 15-22, wherein forming each of the plurality of plated holes/vias comprises forming one of a blind via, a buried via, a stacked via and a through hole.

Clause 24. A printed circuit board test coupon for electrical testing during thermal exposure, comprising:

a substrate having one or more conductive layers and extending between a first side and a second side opposite the first side;

a plurality of plated holes/vias formed within the substrate of the test coupon or extending through the entire substrate of the test coupon from a first surface on the first side A of the plated hole/via to a second surface on the second side B of the plated hole/via;

a first plurality of trace patterns defining a first pattern, each of the first plurality of trace patterns interconnecting a subset of the plurality of plated holes/vias on the first side of the plated holes/vias;

a second plurality of trace patterns defining a second pattern, each of the second plurality of trace patterns interconnecting a different subset of the plurality of holes/vias on the second side of the plated holes/vias, the second pattern being different than the first pattern; and a connector pattern defined within or on the surface of the substrate, the first and second plurality of trace patterns connected to a plurality of connection points in the connector pattern, wherein a measurement of resistance of each plated hole/via is provided by connecting 2 wires of a 4-wire kelvin bridge measurement system to the first side and connecting 2 wires of a 4-wire kelvin bridge measurement system to the second, side of the plated hole/via using connection points for one of the first plurality of trace patterns and one of the second plurality of trace patterns that connect to said plated hole/via.

Clause 25. The test coupon of clause 24, wherein the plurality of plated holes/vias consist of seven plated holes/vias formed within or completely through the substrate.

Clause 26. The test coupon of any of clauses 24-25, wherein the first plurality of trace patterns comprises four trace patterns, each trace pattern connecting to the first side of at least one of the plated holes/vias.

Clause 27. The test coupon of any of clauses 24-26, wherein the second plurality of trace patterns comprises four trace patterns, each trace pattern connecting to the second side of at least one of the plated holes/vias.

Clause 28. The test coupon of any of clauses 24-27, wherein at least one of the second plurality of trace patterns is configured to measure temperature and at least one of the second plurality of trace patterns is configured to measure calibration/drift by resistance measurements.

Clause 29. The test coupon of any of clauses 24-28, further comprising a daisy chain of plated holes/vias in the substrate consecutively connected to connection points in the connector via one of the first plurality of trace patterns on the first side and one of the second plurality of trace patterns on the second side.

Clause 30. The test coupon of any of clauses 24-29, wherein each of the plurality of plated holes/vias comprises one of a blind via, a buried via, a stacked via and a through hole.

Clause 31. A printed circuit board test coupon for electrical testing during thermal exposure, comprising:

a substrate having one or more conductive layers and extending between a first side and a second side opposite the first side;

a plurality of plated holes/vias comprising seven plated holes/vias formed within the substrate of the test coupon or extending through the entire substrate of the test coupon from a first surface on the first side of the plated hole/via to a second surface on the second side of the plated hole/via;

a first plurality of trace patterns defining a first pattern comprising four trace patterns on the first side, each of the four trace patterns connecting to at least one of the plated holes/vias on the first side of the plated holes/vias;

a second plurality of trace patterns defining a second pattern comprising four trace patterns on the second side, each of the four trace patterns connecting to at least one of the plated holes/vias on the second side of the plated holes/vias, the second pattern being different than the first pattern and each of the seven plated holes/vias connecting to one of the trace patterns on the first side and one of the trace patterns on the second side; and a connector pattern defined in the substrate having twenty connection points, the first and second plurality of trace patterns connected to the twenty connection points in the connector pattern, wherein a measurement of resistance of each of the seven plated holes/vias is provided by connecting 2 wires each of a 4-wire kelvin bridge measurement system to the first and second sides of the plated hole/via using connection points in the connector pattern for one of the first plurality of trace patterns and one of the second plurality of trace patterns that connect to said plated hole/via.

Clause 32. The test coupon of clause 31, wherein at least one of the second plurality of trace patterns is configured to measure temperature and at least one of the second plurality of trace patterns is configured to measure calibration/drift by resistance measurements.

Clause 33. The test coupon of any of clauses 31-32, further comprising a daisy chain of plated holes/vias in the substrate consecutively connected to connection points in the connector via one of the first plurality of trace patterns on the first side and one of the second plurality of trace patterns on the second side.

Clause 34. The test coupon of any of clauses 31-33, wherein each of the plurality of plated holes/vias comprises one of a blind via, a buried via, a stacked via and a through hole.

Clause 35. A method of testing the test coupon of claim 8, comprising:
- inserting the test coupon into a test machine;
- varying a temperature of a fluid toward a first temperature;
- exposing the test coupon to the fluid at the first temperature;
- varying a temperature of the fluid toward a second temperature; and
- exposing the test coupon to the fluid at the second temperature.

Clause 36. The method of clause 35, wherein the fluid is air.

Clause 37. The method of any of clauses 35-36, wherein the first temperature is lower than the second temperature.

Clause 38. The method of any of clauses 35-37, wherein the first temperature is between about 0 degrees Celsius and about −65 degrees Celsius.

Clause 39. The method of any of clauses 35-38, wherein the second temperature is between about 85 degrees Celsius and about 260 degrees Celsius.

Clause 40. The method of any of clauses 35-39, further comprising measuring a resistance of at least one of the plated holes/vias while the test coupon is exposed to the fluid at one or both of the first and second temperatures.

Clause 41. A method for testing the test coupon of claim 8, comprising:
- inserting the test coupon into a test machine;
- stabilizing the test coupon at a first temperature;
- measuring a first resistance of the test coupon at the first temperature;
- stabilizing the test coupon at a second temperature different than the first temperature;
- measuring a second resistance of the test coupon at the second temperature; and
- determining a failure of the test coupon from one or both of the first and second resistance measurements.

Clause 42. The method of clause 41, further comprising cycling the test coupon between the first and second temperatures while measuring resistance and determining a failure of the test coupon from comparing successive resistance measurements made at either or both of the first and second temperatures.

Clause 43. The method of any of clauses 41-42, further comprising determining a first duration for the test coupon to reach the second resistance from the first resistance and determining a second duration for the test coupon to reach the second resistance from the first resistance.

While certain embodiments of the inventions have been described, these embodiments have been presented by way of example only and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a subcombination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of the stated amount. As another example, in certain embodiments, the terms "generally parallel" and "substantially parallel" refer to a value, amount, or characteristic that departs from exactly parallel by less than or equal to 15 degrees.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

Of course, the foregoing description is that of certain features, aspects and advantages of the present invention, to which various changes and modifications can be made without departing from the spirit and scope of the present invention. For example, though embodiments above describe a test coupon having a particular number of plated holes/vias, test nets, or particular number of connection points in the connector pattern, the invention is not limited to any particular number of plated holes/vias, test nets, any particular number of connection points in the connector pattern, nor any particular number of trace patterns or connector patterns. Additionally, the PCB test coupon described above is not limited to any particular size (e.g., vary from ½ inch by 1 inch to 1 inch by 2 inches, but may be smaller or larger). Moreover, the test coupon need not feature all of the objects, advantages, features and aspects discussed above. Thus, for example, those of skill in the art will recognize that the invention can be embodied or carried out in a manner that achieves or optimizes one advantage or a group of advantages as taught herein without necessarily achieving other objects or advantages as may be taught or suggested herein. In addition, while a number of variations of the invention have been shown and described in detail, other modifications and methods of use, which are within the scope of this invention, will be readily apparent to those of skill in the art based upon this disclosure. It is contemplated that various combinations or subcombinations of these specific features and aspects of embodiments may be made and still fall within the scope of the invention. Accordingly, it should be understood that various features and aspects of the disclosed embodiments can be combined with or substituted for one another in order to form varying modes of the discussed test coupon.

What is claimed is:

1. A printed circuit board test coupon for electrical testing during thermal exposure, comprising:
    a substrate having one or more conductive layers and extending between a first side and a second side opposite the first side;
    a plurality of plated holes/vias consist of seven plated holes/vias formed within or completely through the substrate of the test coupon or extending through the entire substrate of the test coupon from a first surface on the first side A of the plated hole/via to a second surface on the second side B of the plated hole/via;
    a first plurality of trace patterns defining a first pattern, each of the first plurality of trace patterns interconnecting a subset of the plurality of plated holes/vias on the first side of the plated holes/vias;
    a second plurality of trace patterns defining a second pattern, each of the second plurality of trace patterns interconnecting a different subset of the plurality of holes/vias on the second side of the plated holes/vias, the second pattern being different than the first pattern; and
    a connector pattern defined within or on the surface of the substrate, the first and second plurality of trace patterns connected to a plurality of connection points in the connector pattern,
    wherein a measurement of resistance of each plated hole/via is provided by connecting 2 wires of a 4-wire kelvin bridge measurement system to the first side and connecting 2 wires of a 4-wire kelvin bridge measurement system to the second, side of the plated hole/via using connection points for one of the first plurality of trace patterns and one of the second plurality of trace patterns that connect to said plated hole/via.

2. The test coupon of claim 1, wherein the first plurality of trace patterns consists of four trace patterns, each trace pattern connecting to the first side of at least one of the plated holes/vias.

3. The test coupon of claim 1, wherein the second plurality of trace patterns comprises four trace patterns, each trace pattern connecting to the second side of at least one of the plated holes/vias.

4. The test coupon of claim 1, wherein at least one of the second plurality of trace patterns is configured to measure temperature and at least one of the second plurality of trace patterns is configured to measure calibration/drift by resistance measurements.

5. The test coupon of claim 1, further comprising a daisy chain of plated holes/vias in the substrate consecutively connected to connection points in the connector via one of the first plurality of trace patterns on the first side and one of the second plurality of trace patterns on the second side.

6. The test coupon of claim 1, wherein each of the plurality of plated holes/vias comprises one of a blind via, a buried via, a stacked via and a through hole.

7. A printed circuit board test coupon for electrical testing during thermal exposure, comprising:
 a substrate having one or more conductive layers and extending between a first side and a second side opposite the first side;
 a plurality of plated holes/vias comprising seven plated holes/vias formed within the substrate of the test coupon or extending through the entire substrate of the test coupon from a first surface on the first side of the plated hole/via to a second surface on the second side of the plated hole/via;
 a first plurality of trace patterns defining a first pattern comprising four trace patterns on the first side, each of the four trace patterns connecting to at least one of the plated holes/vias on the first side of the plated holes/vias;
 a second plurality of trace patterns defining a second pattern comprising four trace patterns on the second side, each of the four trace patterns connecting to at least one of the plated holes/vias on the second side of the plated holes/vias, the second pattern being different than the first pattern and each of the seven plated holes/vias connecting to one of the trace patterns on the first side and one of the trace patterns on the second side; and
 a connector pattern defined in the substrate having twenty connection points, the first and second plurality of trace patterns connected to the twenty connection points in the connector pattern,
 wherein a measurement of resistance of each of the seven plated holes/vias is provided by connecting 2 wires each of a 4-wire kelvin bridge measurement system to the first and second sides of the plated hole/via using connection points in the connector pattern for one of the first plurality of trace patterns and one of the second plurality of trace patterns that connect to said plated hole/via.

8. The test coupon of claim 7, wherein at least one of the second plurality of trace patterns is configured to measure temperature and at least one of the second plurality of trace patterns is configured to measure calibration/drift by resistance measurements.

9. The test coupon of claim 7, further comprising a daisy chain of plated holes/vias in the substrate consecutively connected to connection points in the connector via one of the first plurality of trace patterns on the first side and one of the second plurality of trace patterns on the second side.

10. The test coupon of claim 7, wherein each of the plurality of plated holes/vias comprises one of a blind via, a buried via, a stacked via and a through hole.

11. A method of testing a printed circuit board test coupon for electrical testing during thermal exposure, comprising:
 inserting the test coupon into a test machine, the test coupon comprising
  a substrate having one or more conductive layers and extending between a first side and a second side opposite the first side,
  a plurality of plated holes/vias comprising seven plated holes/vias formed within the substrate of the test coupon or extending through the entire substrate of the test coupon from a first surface on the first side of the plated hole/via to a second surface on the second side of the plated hole/via,
  a first plurality of trace patterns defining a first pattern comprising four trace patterns on the first side, each of the four trace patterns connecting to at least one of the plated holes/vias on the first side of the plated holes/vias,
  a second plurality of trace patterns defining a second pattern comprising four trace patterns on the second side, each of the four trace patterns connecting to at least one of the plated holes/vias on the second side of the plated holes/vias, the second pattern being different than the first pattern and each of the seven plated holes/vias connecting to one of the trace patterns on the first side and one of the trace patterns on the second side, and
  a connector pattern defined in the substrate having twenty connection points, the first and second plurality of trace patterns connected to the twenty connection points in the connector pattern;
 varying a temperature of a fluid toward a first temperature;
 exposing the test coupon to the fluid at the first temperature;
 varying a temperature of the fluid toward a second temperature; and
 exposing the test coupon to the fluid at the second temperature.

12. The method of claim 11, wherein the fluid is air.

13. The method of claim 11, wherein the first temperature is lower than the second temperature.

14. The method of claim 13, wherein the first temperature is between about 0 degrees Celsius and about −65 degrees Celsius.

15. The method of claim 13, wherein the second temperature is between about 85 degrees Celsius and about 260 degrees Celsius.

16. The method of claim 11, further comprising measuring a resistance of at least one of the plated holes/vias while the test coupon is exposed to the fluid at one or both of the first and second temperatures, wherein measuring the resistance of said at least one of the plated holes/vias includes connecting 2 wires each of a 4-wire kelvin bridge measurement system to the first and second sides of said at least one of the plated holes/vias using connection points in the connector pattern for one of the first plurality of trace patterns and one of the second plurality of trace patterns that connect to said plated hole/via.

17. A method for testing a printed circuit board test coupon for electrical testing during thermal exposure, comprising:
 inserting the test coupon into a test machine, the test coupon comprising
  a substrate having one or more conductive layers and extending between a first side and a second side opposite the first side,
  a plurality of plated holes/vias comprising seven plated holes/vias formed within the substrate of the test coupon or extending through the entire substrate of the test coupon from a first surface on the first side of the plated hole/via to a second surface on the second side of the plated hole/via, a first plurality of trace patterns defining a first pattern comprising four trace patterns on the first side, each of the four trace patterns connecting to at least one of the plated holes/vias on the first side of the plated holes/vias, a second plurality of trace patterns defining a second pattern comprising four trace patterns on the second side, each of the four trace patterns connecting to at least one of the plated holes/vias on the second side of the plated holes/vias, the second pattern being different than the first pattern and each of the seven plated holes/vias connecting to one of the trace patterns on the first side and one of the trace patterns on the second side, and a connector pattern defined in the substrate having twenty connection points, the first and second plurality of trace patterns connected to the twenty connection points in the connector pattern;

stabilizing the test coupon at a first temperature;

measuring a first resistance of the test coupon at the first temperature;

stabilizing the test coupon at a second temperature different than the first temperature;

measuring a second resistance of the test coupon at the second temperature; and determining a failure of the test coupon from one or both of the first and second resistance measurements, wherein measuring the first and second resistance of the test coupon includes measuring a resistance of each of the seven plated holes/vias by connecting 2 wires each of a 4-wire kelvin bridge measurement system to the first and second sides of the plated hole/via using connection points in the connector pattern for one of the first plurality of trace patterns and one of the second plurality of trace patterns that connect to said plated hole/via.

18. The method of claim 17, further comprising cycling the test coupon between the first and second temperatures and determining a failure of the test coupon from comparing successive resistance measurements made at either or both of the first and second temperatures.

19. The method of claim 17, further comprising determining a first duration for the test coupon to reach the second resistance from the first resistance and determining a second duration for the test coupon to reach the second resistance from the first resistance.

* * * * *

UNITED STATES PATENT AND TRADEMARK OFFICE
CERTIFICATE OF CORRECTION

PATENT NO. : 10,379,153 B1  
APPLICATION NO. : 16/399470  
DATED : August 13, 2019  
INVENTOR(S) : Robert Neves Page 1 of 1

It is certified that error appears in the above-identified patent and that said Letters Patent is hereby corrected as shown below:

In the Specification

In Column 7, Line 16, delete "100"." and insert -- 100'". --

In Column 16, Line 15, delete "100"." and insert -- 100'". --

In Column 17, Line 31, delete "100"." and insert -- 100'". --

In Column 17, Line 33, delete "100"." and insert -- 100'". --

In Column 18, Line 10 approx., delete "100"." and insert -- 100'". --

In Column 18, Line 37, delete "100"." and insert -- 100'". --

Signed and Sealed this  
Third Day of December, 2019

Andrei Iancu  
*Director of the United States Patent and Trademark Office*